(12) United States Patent
Mori

(10) Patent No.: US 9,457,376 B2
(45) Date of Patent: Oct. 4, 2016

(54) METHOD OF MANUFACTURING GAS BARRIER FILM, GAS BARRIER FILM, AND ORGANIC PHOTOELECTRIC CONVERSION ELEMENT

(75) Inventor: Takahiro Mori, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 780 days.

(21) Appl. No.: 13/806,817

(22) PCT Filed: Jun. 23, 2011

(86) PCT No.: PCT/JP2011/064376
§ 371 (c)(1),
(2), (4) Date: Dec. 24, 2012

(87) PCT Pub. No.: WO2012/008277
PCT Pub. Date: Jan. 19, 2012

(65) Prior Publication Data
US 2013/0092239 A1    Apr. 18, 2013

(30) Foreign Application Priority Data
Jul. 14, 2010   (JP) ................. 2010-159464

(51) Int. Cl.
*B05D 3/06* (2006.01)
*B05D 7/04* (2006.01)
(Continued)

(52) U.S. Cl.
CPC ............. *B05D 3/067* (2013.01); *B05D 7/04* (2013.01); *C23C 18/122* (2013.01);
(Continued)

(58) Field of Classification Search
CPC ........... H01L 51/5253; H01L 51/5237; H01L 51/56; H01L 31/0481; H01L 31/02167; H01L 31/0392; H01L 31/048; H01L 31/049; H01L 27/3244; H01L 51/44; H01L 51/448; H01L 51/5246; B05D 3/067; B05D 7/04; B05D 2252/02; C23C 18/122; C23C 18/14; Y02E 10/549; Y02E 70/521

USPC ............................................................ 257/40
See application file for complete search history.

(56) References Cited

U.S. PATENT DOCUMENTS

| | | | |
|---|---|---|---|
| 2009/0167164 A1* | 7/2009 | Fukuda | H01L 51/5237 313/504 |
| 2010/0166977 A1* | 7/2010 | Brand | C08J 7/047 427/515 |

(Continued)

FOREIGN PATENT DOCUMENTS

| | | | | |
|---|---|---|---|---|
| JP | 2009-503157 | 1/2009 | | |
| JP | 2009-255040 | 11/2009 | | |
| JP | WO 2010026869 A1 * | 3/2010 | | B32B 27/32 |

OTHER PUBLICATIONS

Machine Translation of WO 2010026869 A1, Kawamura.*
(Continued)

*Primary Examiner* — Jayne Mershon
*Assistant Examiner* — Mayla Gonzalez Ramos
(74) *Attorney, Agent, or Firm* — Lucas & Mercanti, LLP

(57) ABSTRACT

Disclosed is a method of manufacturing a gas barrier film possessing a substrate in the form of a belt and provided thereon, a gas barrier layer containing silicon oxide, possessing a coating step in which a coating solution comprising a polysilazane compound is coated on the substrate to form a coating film, and a UV radiation exposure step in which the coating film is exposed to the vacuum UV radiation emitted from the plural light sources facing the substrate while moving the substrate on which the coating film is formed relatively to the plural light sources, the plural light sources each exhibiting even illuminance along a width direction of the substrate to form a gas barrier layer, and provided is a method of manufacturing a gas barrier film by which the gas barrier film suitable for production coupled with roll-to-roll system, exhibiting excellent gas barrier performance can be prepared.

17 Claims, 15 Drawing Sheets

(51) Int. Cl.
*C23C 18/12* (2006.01)
*C23C 18/14* (2006.01)
*H01L 51/44* (2006.01)
*H01L 51/52* (2006.01)

(52) U.S. Cl.
CPC .............. *C23C 18/14* (2013.01); *H01L 51/44* (2013.01); *H01L 51/448* (2013.01); *B05D 2252/02* (2013.01); *H01L 51/5253* (2013.01); *Y02E 10/549* (2013.01); *Y02P 70/521* (2015.11)

(56) References Cited

U.S. PATENT DOCUMENTS

2011/0086220 A1* 4/2011 Yoshida .................. B32B 7/12
  428/317.5
2012/0241889 A1* 9/2012 Takemura et al. ............ 257/431

OTHER PUBLICATIONS

Leibniz Institute of Surface Modification Biannual Report 2008 / 2009: p. 18-p. 21.

* cited by examiner

METHOD OF MANUFACTURING GAS BARRIER FILM, GAS BARRIER FILM, AND ORGANIC PHOTOELECTRIC CONVERSION ELEMENT

CROSS REFERENCE TO RELATED APPLICATION

This Application is a 371 of PCT/JP2011/064376 filed on Jun. 23, 2011 which, in turn, claimed the priority of Japanese Patent Application No. 2010-159464 filed on Jul. 14, 2010, both applications are incorporated by reference herein.

TECHNICAL FIELD

The present invention relates to a gas barrier film and a method of manufacturing the gas barrier, and relates specifically to a package mainly for an electronic device or the like or a gas barrier film used for a gas barrier film used for an organic electroluminescence (EL) element, a solar cell element, a liquid crystal display element and so forth, and a method of manufacturing the gas barrier.

BACKGROUND

A gas barrier film, in which a plurality of layers including metal oxide thin films such as an aluminum oxide thin film, a magnesium oxide thin film, a silicon oxide thin film and so forth are laminated and formed on the surface of a plastic substrate or film has been widely utilized conventionally for packaging application to pack goods necessary for shielding various gases such as water vapor, oxygen and so forth, and to avoid alteration in quality of food, industrial goods, pharmaceutical products and so forth.

Further, in those other than packaging application, it has been used as a solar cell element, an organic electroluminescence (EL) element, a liquid crystal display element or the like.

As methods each of forming such a gas barrier film, known are a chemical vapor deposition method (a plasma CVD method: Chemical Vapor Deposition) by which a film is formed on a substrate during oxidation with oxygen plasma at reduced pressure, employing an organic silicon compound typified by tetraethoxy silane (TEOS), and a sputtering method by which metal silicon is evaporated employing a semiconductor laser to deposit it on a substrate in the presence of oxygen.

These methods have been desirably used for formation of metal oxide thin films such as a $SiO_2$ thin film and so forth, since a thin film having an accurate composition can be formed on a substrate, but poor productivity has largely resulted since time is consumed on the ground of reduced pressure and opening to the atmosphere, difficult continuous production, and large-size equipment to be used because of deposition at reduced pressure.

In order to solve these problems, utilized are a method by which a silicon-containing compound is coated to form a silicon oxide thin film via modification of the coating film, and the same CVD method as previously mentioned in which plasma is generated under atmospheric pressure to form a film, and a gas barrier film has also been applied thereto, and studied.

As a silicon oxide film which can be generally prepared by a solution process, known is a preparation technique called a sol-gel method employing an alkoxide compound as raw material. In this sol-gel method, heating to high temperature is generally necessary, and large contraction in volume further occurs in the process of dehydration-condensation reaction, resulting in generation of a large number of defects in the film.

In order to avoid the foregoing, a method by which an organic substance or the like directly having no involvement in formation of oxide is mixed in a raw material solution is known, but when regarding a film as a whole, it lowers a barrier property that each of these organic substance remains in the film, resulting in appearance of an insufficient barrier property.

For this reason, it was difficult to use an oxide film to be prepared by a sol-gel method as a protective film for a flexible electronic device as it is.

As another method, it is proposed that a silicon oxide film is formed using a silazane compound having a silazane structure (Si—N) as a basic structure in raw material.

Since reaction in this case is not dehydration-condensation reaction but direct substitution reaction from nitrogen to oxygen, mass yield before and after the reaction is a large value such as 80% to 100%, whereby it is known that a dense film having reduced defects in the film, caused by contraction in volume.

However, since temperature higher than 450° C. should be applied for formation of a silicon oxide film via substitution reaction of the silazane compound, it is impossible that a flexible substrate made of plastic or the like is suitably applicable.

As a means to solve such a problem, proposed is a method by which a coating film having coated and formed from a silazane compound is exposed to vacuum UV radiation to form a silicon oxide film.

Oxidation reaction with active oxygen or ozone can be accelerated while directly cutting via action with only photon called a photon process for atomic binding, employing light energy having a wavelength of 100-200 nm called vacuum UV radiation (hereinafter, referred to also as "VUV" or "VUV radiation") larger than interatomic binding force inside the silazane compound to form a silicon oxide film at considerably low temperature.

From the viewpoint of preparation of a gas barrier film, the gas barrier film is industrially desired to be continuously manufactured by a so-called roll-to-roll system.

Thus, as a manufacturing method employing the roll-to-roll system, known is a method by which a film is conveyed at a speed of 1 min/min or 10 m/min, and a silazane compound-coating film is exposed to an excimer lamp to prepare a gas barrier film (refer to Patent Document 1 and Nonpatent Document 1).

However, in these methods, there appeared a problem such that productivity was insufficient, and barrier performance of a gas barrier film was often insufficient.

PRIOR ART DOCUMENT

Patent Document

Patent Document 1: Published Japanese translation of PCT international Publication No. 2009-503157

NONPATENT DOCUMENT

Nonpatent Document 1: Leibniz Institute of Surface Modification Biannual Report 2008/2009: P 18-P 21

DISCLOSURE OF THE INVENTION

Problems to be Solved by the Invention

The present invention was made on the basis of the above-described problematic situation, and it is a task for solving the problematic situation to provide a method of manufacturing a gas barrier film by which the gas barrier film suitable for production coupled with a roll-to-roll system, exhibiting excellent gas barrier performance can be prepared, and to provide a gas barrier film prepared by the method and a photoelectric conversion element in which the gas barrier film is used, and further to provide a method of manufacturing a gas barrier film by which the gas barrier film suitable for production coupled with a roll-to-roll system, exhibiting excellent productivity and excellent gas barrier performance can be prepared.

Means to Solve the Problems

The above-described problems relating to the present invention are solved by the following structures.

(Structure 1) A method of manufacturing a gas barrier film comprising a substrate in the form of a belt and provided thereon, a gas barrier layer containing silicon oxide, comprising a coating step in which a coating solution comprising a polysilazane compound is coated on the substrate to form a coating film, and a UV radiation exposure step in which the coating film is exposed to vacuum UV radiation emitted from plural light sources facing the substrate while moving the substrate on which the coating film is formed relatively to the plural light sources of the vacuum UV radiation, the plural light sources each exhibiting even illuminance along a width direction of the substrate to form the gas barrier layer, wherein in the UV radiation exposure step, during a period from beginning of vacuum UV radiation exposure to end of the vacuum UV radiation exposure, a surface of the coating film is exposed to the vacuum UV radiation exhibiting an illuminance of not more than 160 mW/cm$^2$; during T period, the surface of the coating film is exposed to the vacuum UV radiation exhibiting an illuminance of not less than 50 mW/cm$^2$ and not more than 160 mW/cm$^2$; and during the T period, energy amount E1 of the vacuum UV radiation to which the surface of the coating film is exposed is not less than 180 mJ/cm$^2$ and not more than 1800 mJ/cm$^2$.

(Structure 2) The method of Structure 1, wherein in the UV radiation exposure step, a ratio of E2/E1 is more than 0 and not more than 0.25, provided that during the period excluding the T period, the surface of the coating film is exposed to the vacuum UV radiation having an energy amount E2.

(Structure 3) The method of Structure 1 or 2, wherein a ratio of a time in the T period to another time in a total period of Z in the UV radiation exposure step is not less than 30%.

(Structure 4) The method of Structure 3, wherein the ratio is not less than 70%.

(Structure 5) The method of Structure 4, wherein the T period in the UV radiation exposure step consists of one period.

(Structure 6) A gas barrier film prepared by the method of any one of Structures 1-5.

(Structure 7) An organic photoelectric conversion element comprising the gas barrier film of Structure 6.

Effect of the Invention

The above-described structures according to the present invention provide a method of manufacturing a gas barrier film by which the gas barrier film suitable for production coupled with a roll-to-roll system, exhibiting excellent gas barrier performance can be prepared, and provide a gas barrier film prepared by the method, and further provide a method of manufacturing a gas barrier film by which the gas barrier film suitable for production coupled with a roll-to-roll system, exhibiting excellent productivity and excellent gas barrier performance can be prepared.

DESCRIPTION OF THE PREFERRED EMBODIMENTS

Figure 1:
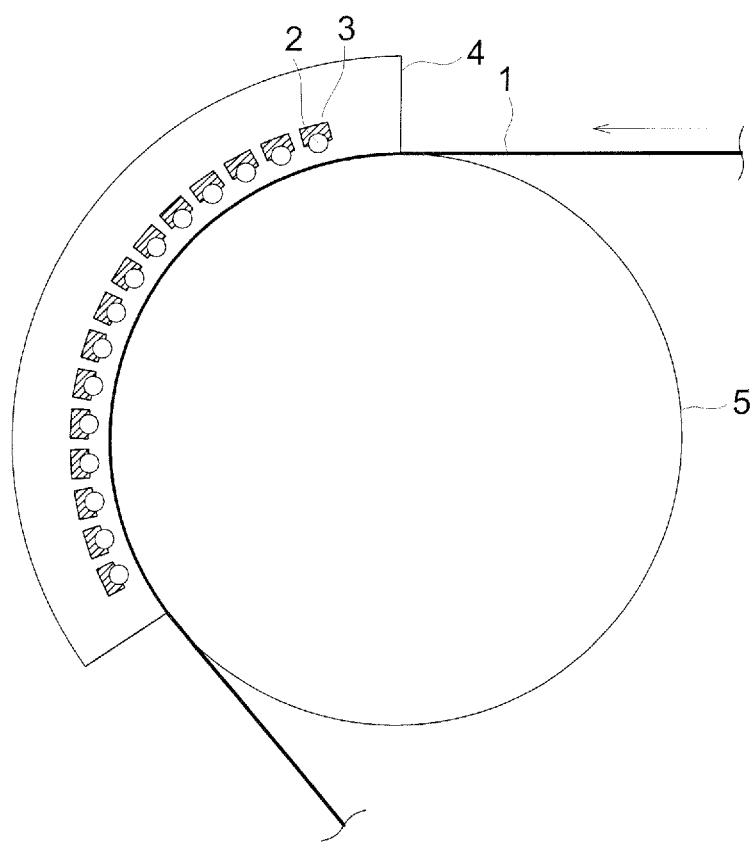
FIG. 1 is a schematic cross-sectional view showing an example of a vacuum UV radiation exposure apparatus employed in a manufacturing method according the present invention.
Figure 2:
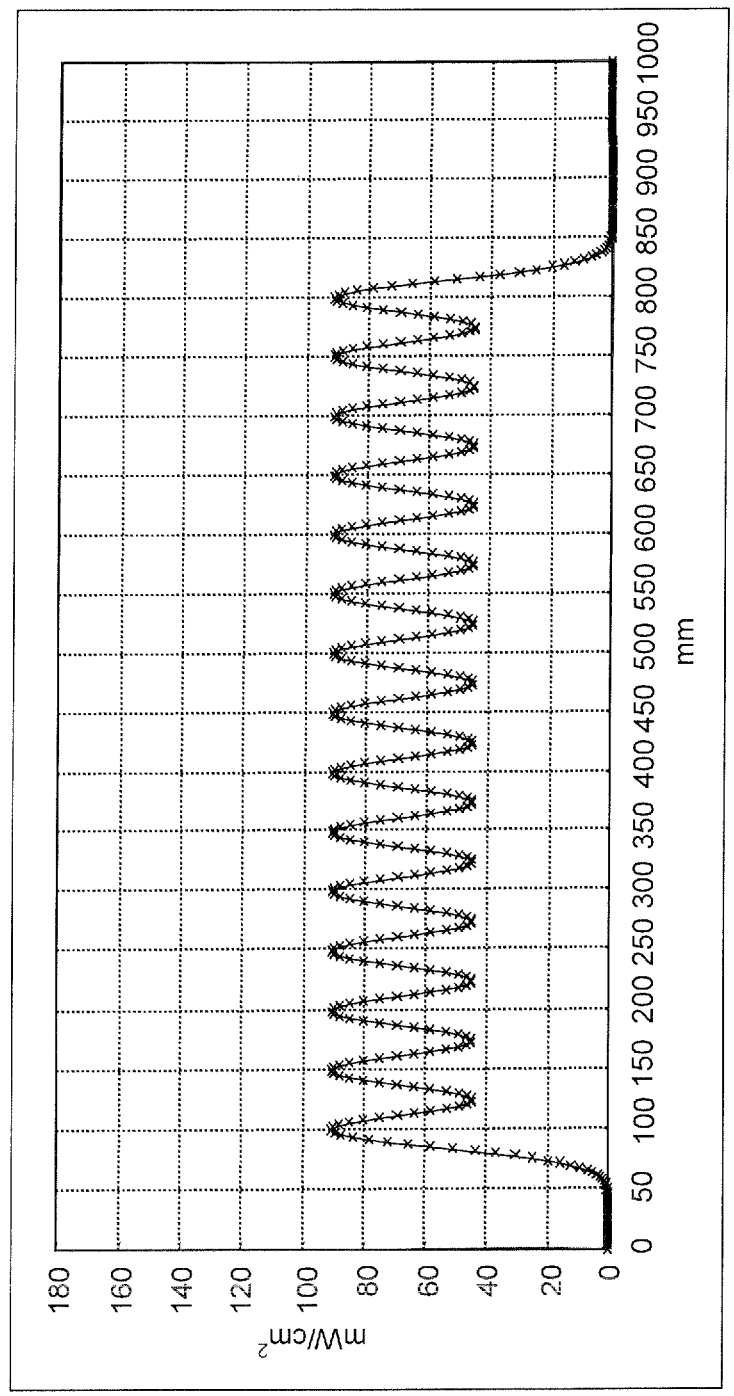
FIG. 2 is a diagram showing an example (pattern A) of temporal change of illuminance to which the surface of a coating film is exposed in a UV radiation exposure step.
Figure 3:
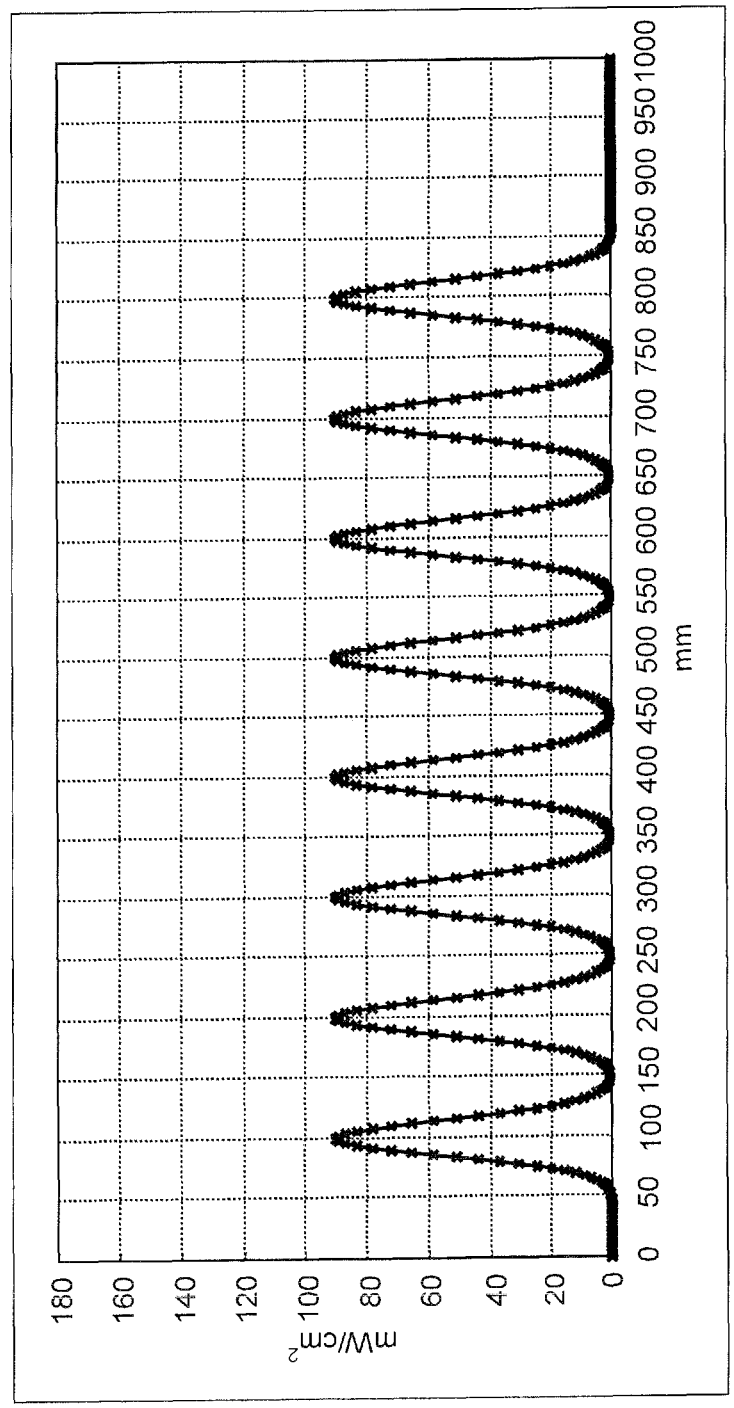
FIG. 3 is a diagram showing an example (pattern B) of temporal change of illuminance to which the surface of a coating film is exposed in a UV radiation exposure step.
Figure 4:
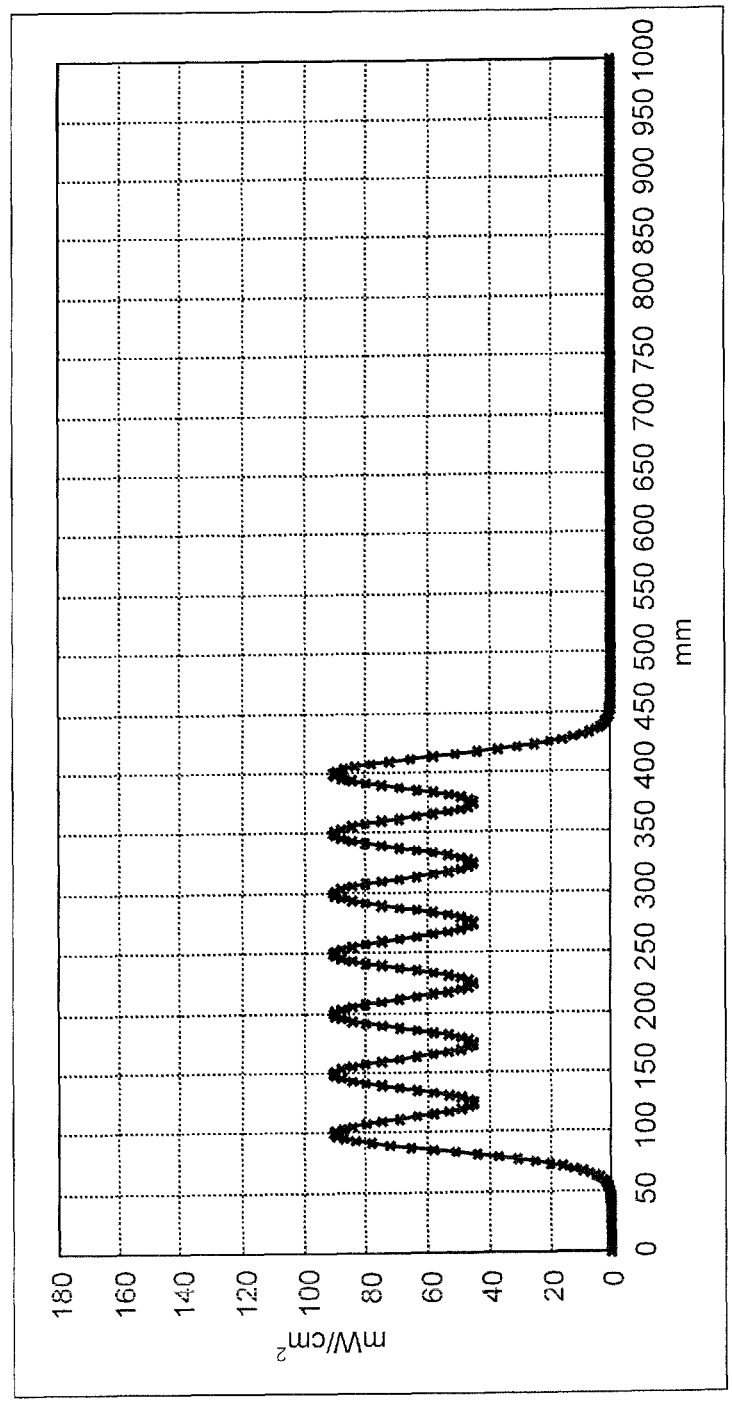
FIG. 4 is a diagram showing an example (pattern C) of temporal change of illuminance to which the surface of a coating film is exposed in a UV radiation exposure step.
Figure 5:
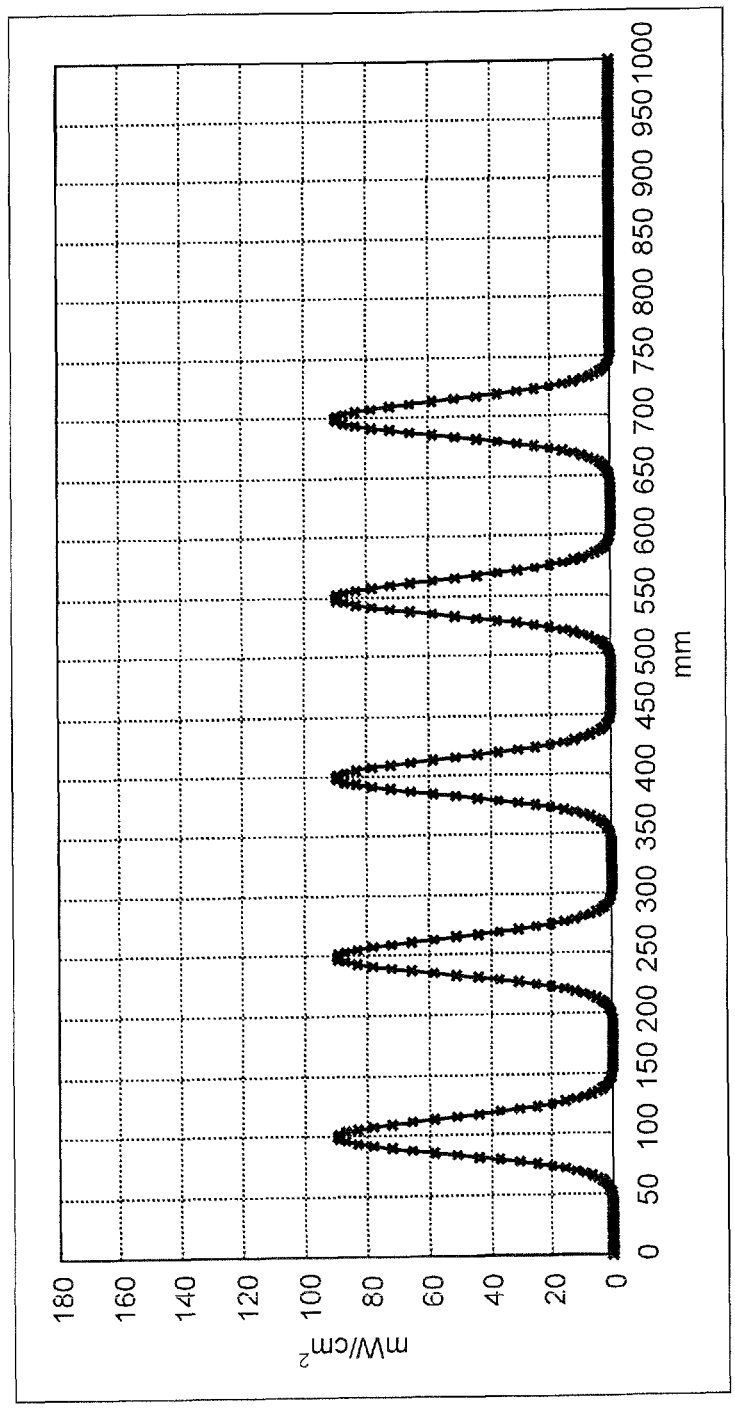
FIG. 5 is a diagram showing an example (pattern D) of temporal change of illuminance to which the surface of a coating film is exposed in a UV radiation exposure step.
Figure 6:
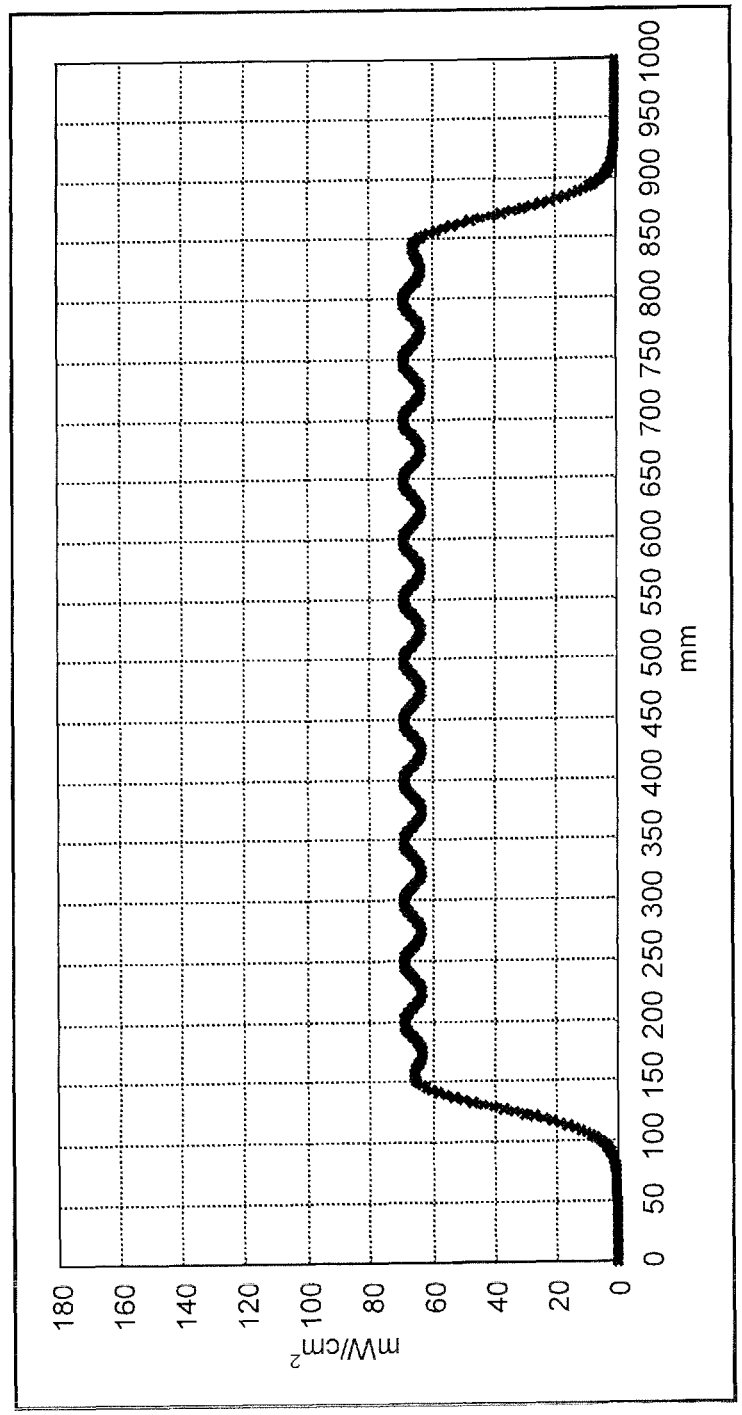
FIG. 6 is a diagram showing an example (pattern E) of temporal change of illuminance to which the surface of a coating film is exposed in a UV radiation exposure step.
Figure 7:
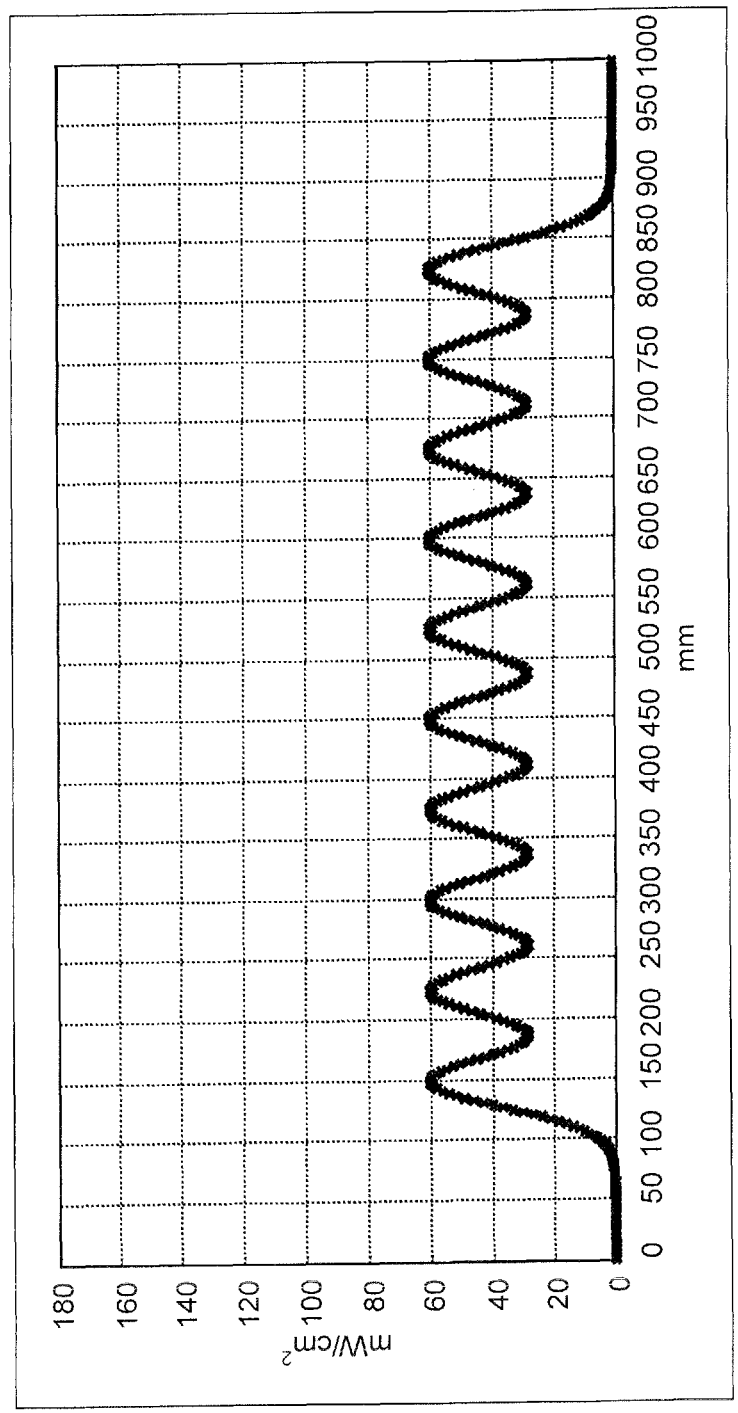
FIG. 7 is a diagram showing an example (pattern F) of temporal change of illuminance to which the surface of a coating film is exposed in a UV radiation exposure step.
Figure 8:
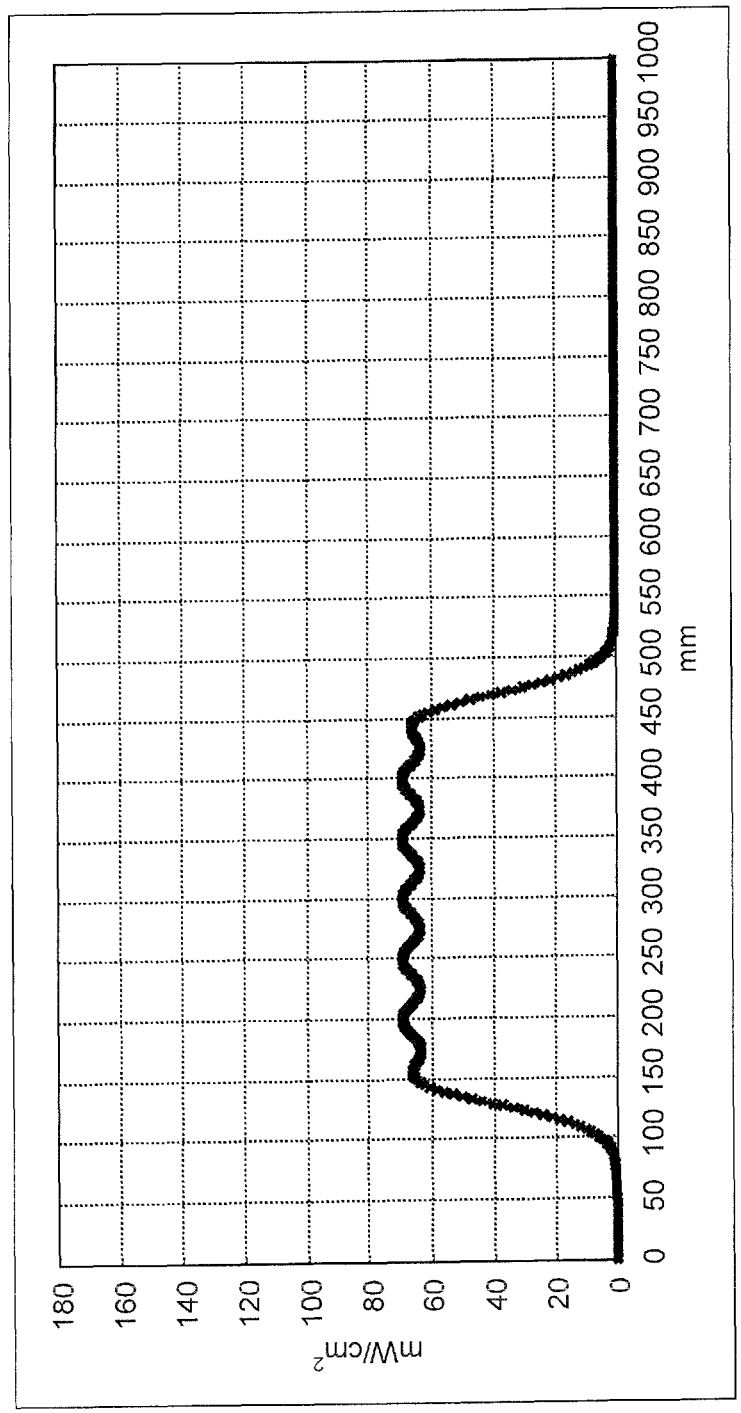
FIG. 8 is a diagram showing an example (pattern G) of temporal change of illuminance to which the surface of a coating film is exposed in a UV radiation exposure step.
Figure 9:
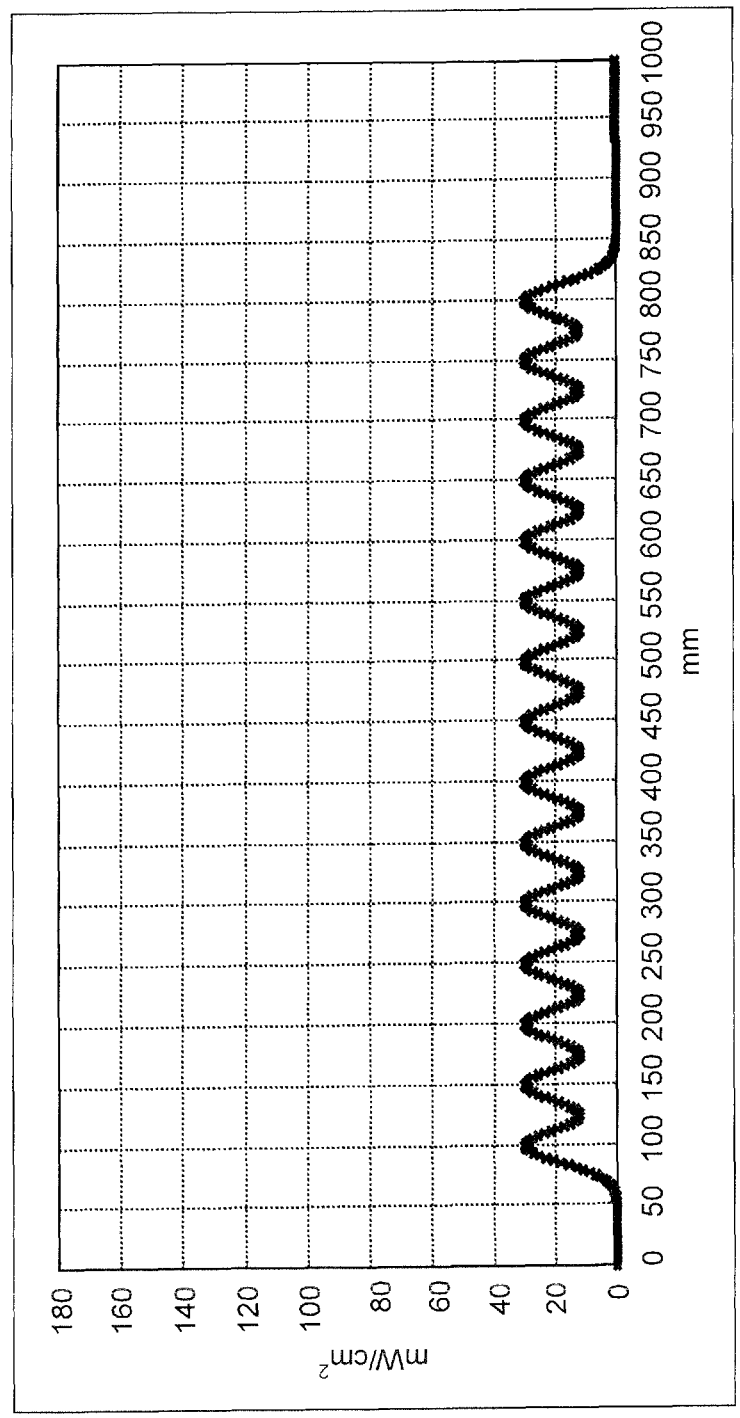
FIG. 9 is a diagram showing an example (pattern H) of temporal change of illuminance to which the surface of a coating film is exposed in a UV radiation exposure step.
Figure 10:
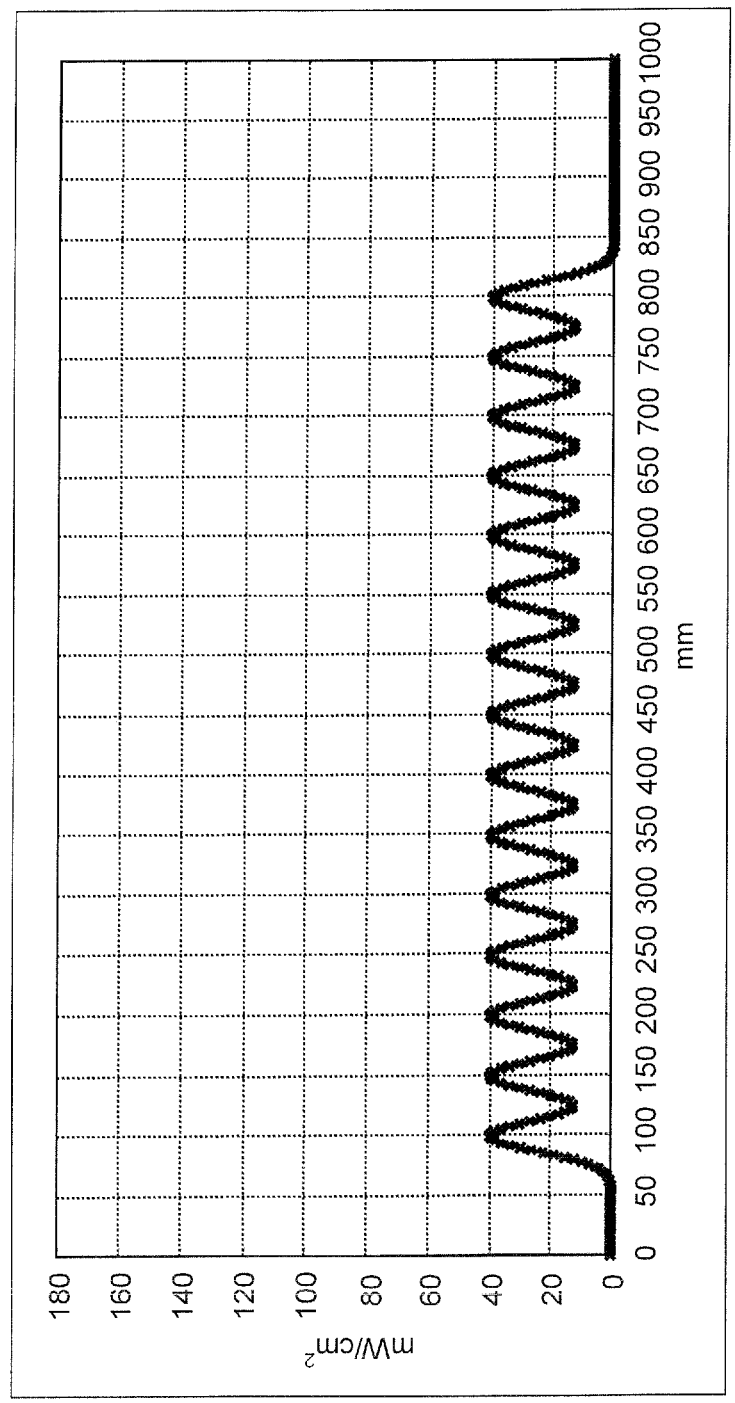
FIG. 10 is a diagram showing an example (pattern I) of temporal change of illuminance to which the surface of a coating film is exposed in a UV radiation exposure step.
Figure 11:
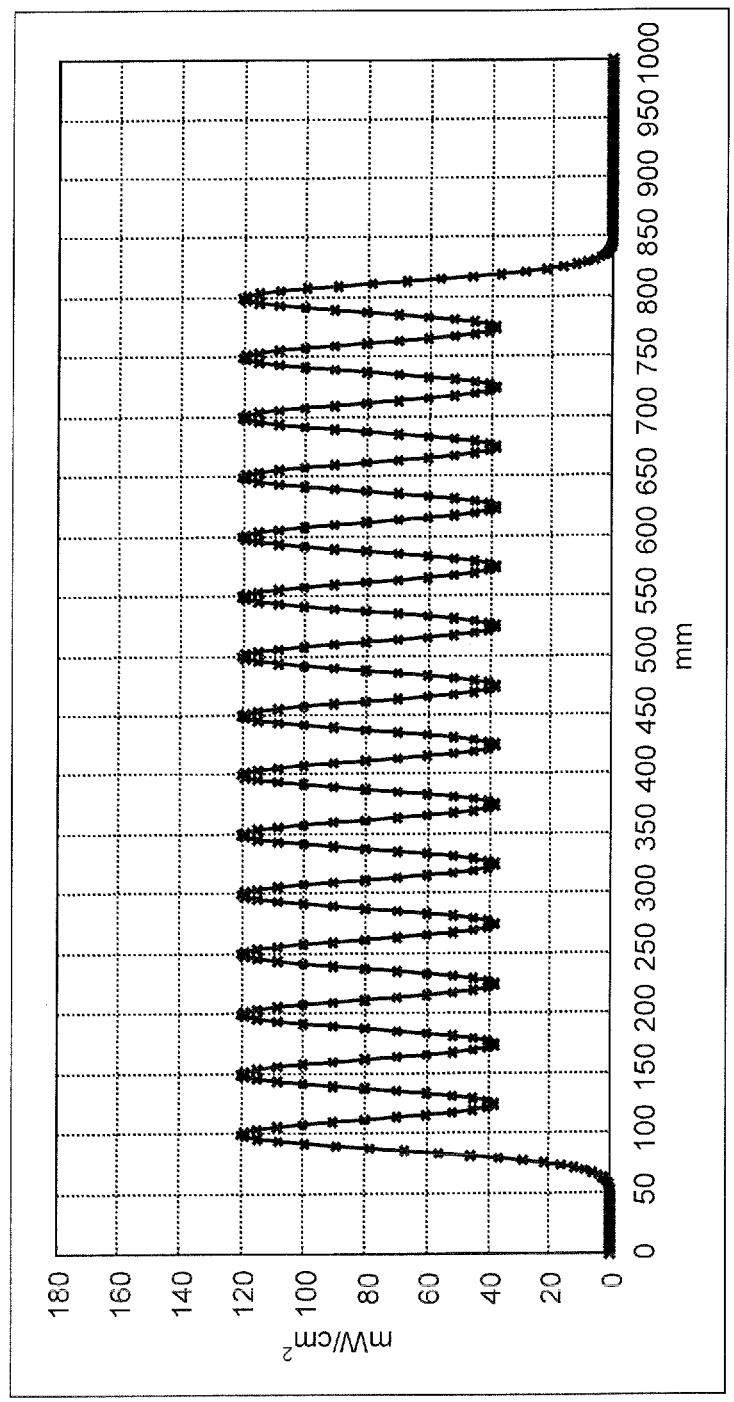
FIG. 11 is a diagram showing an example (pattern J) of temporal change of illuminance to which the surface of a coating film is exposed in a UV radiation exposure step.
Figure 12:
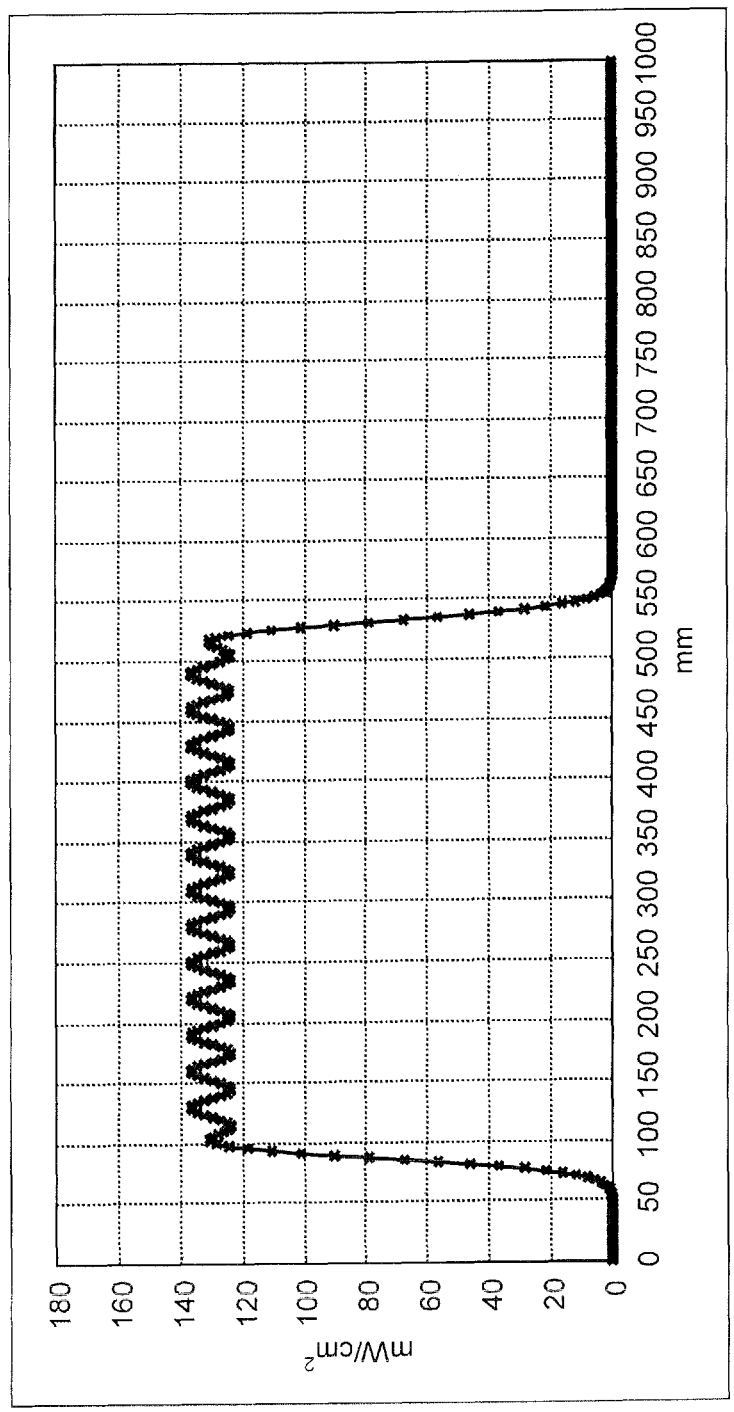
FIG. 12 is a diagram showing an example (pattern K) of temporal change of illuminance to which the surface of a coating film is exposed in a UV radiation exposure step.
Figure 13:
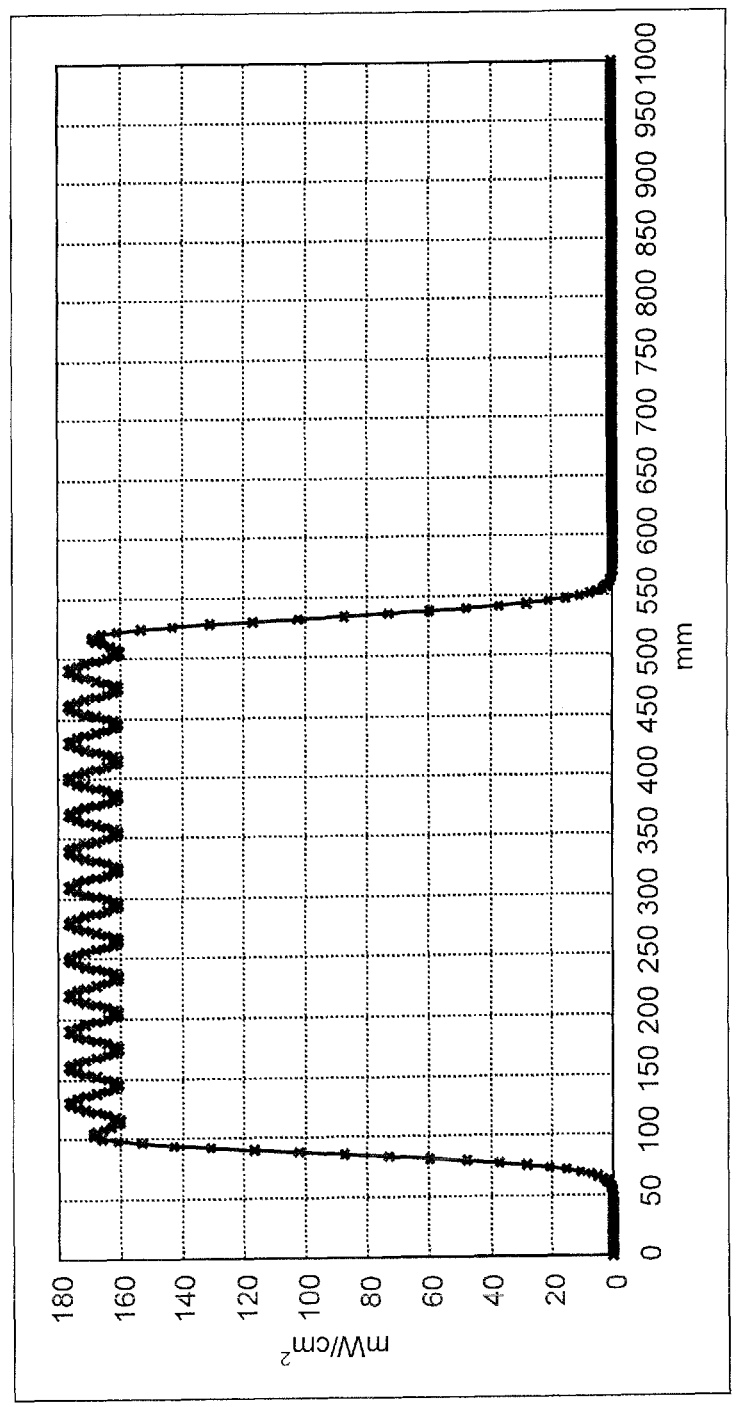
FIG. 13 is a diagram showing an example (pattern L) of temporal change of illuminance to which the surface of a coating film is exposed in a UV radiation exposure step.
Figure 14:
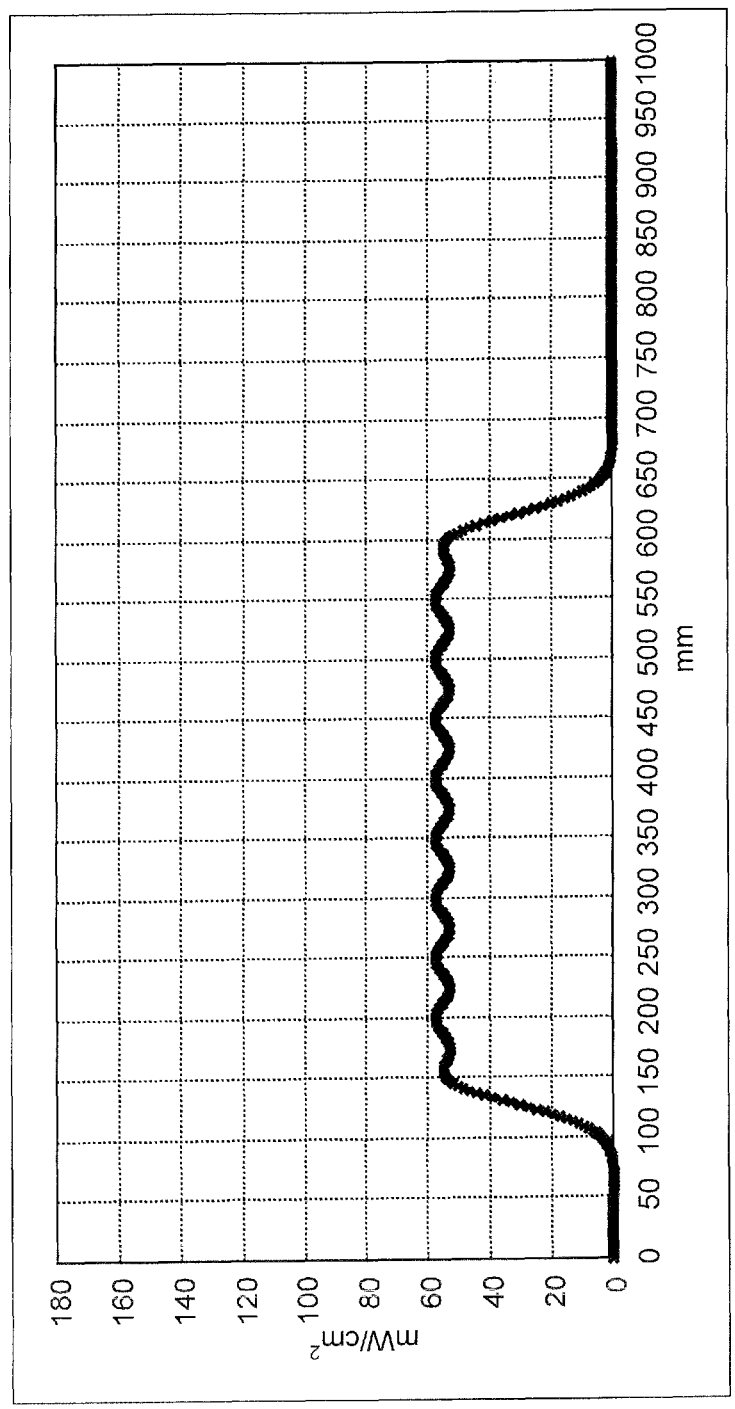
FIG. 14 is a diagram showing an example (pattern M) of temporal change of illuminance to which the surface of a coating film is exposed in a UV radiation exposure step.
Figure 15:
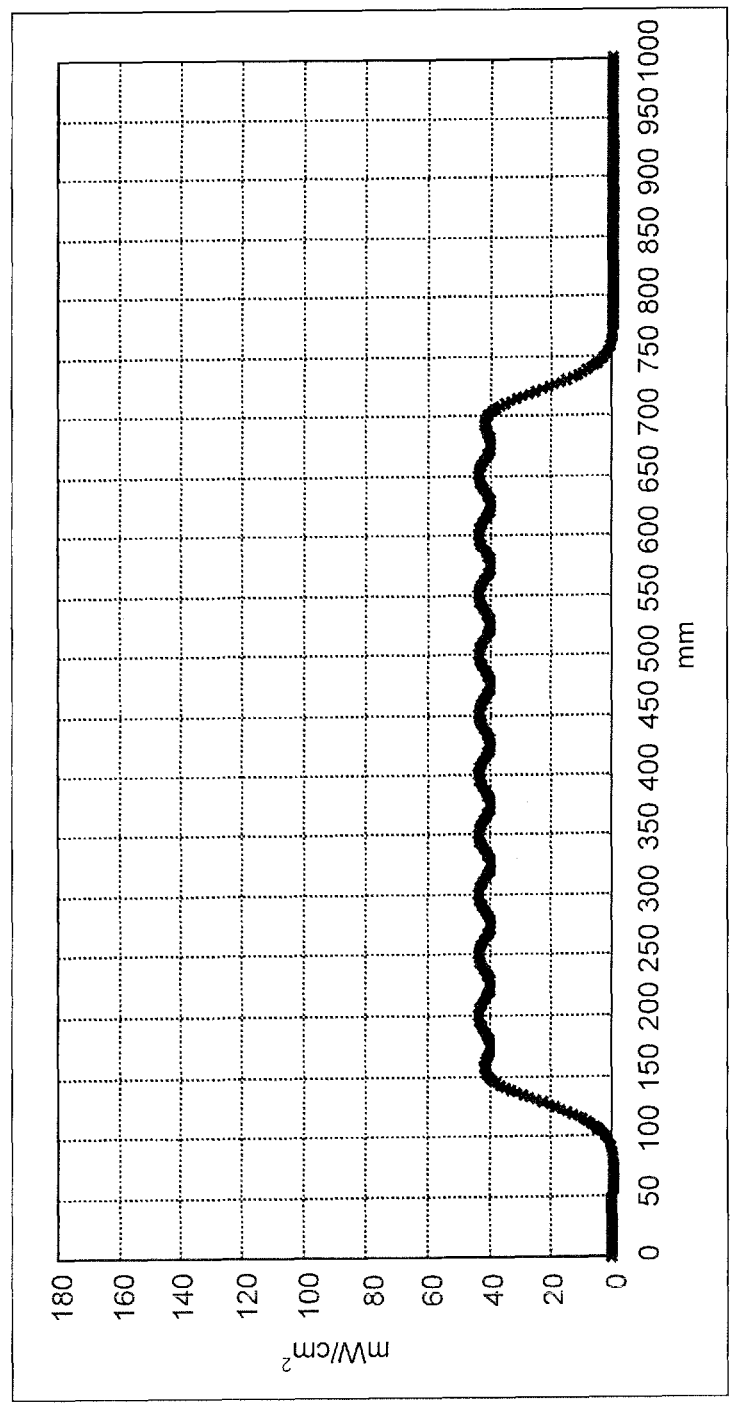
FIG. 15 is a diagram showing an example (pattern N) of temporal change of illuminance to which the surface of a coating film is exposed in a UV radiation exposure step.

As a feature in the present invention, disclosed is a method of manufacturing a gas barrier film comprising a substrate and provided thereon, a gas barrier layer containing silicon oxide, comprising a coating step in which a coating solution comprising a polysilazane compound is coated on the substrate in the form of a belt to form a coating film, and a UV radiation exposure step in which the substrate on which the coating film is formed is moved relatively to plural light sources of vacuum UV radiation (VUV), and the coating film is exposed to the vacuum UV radiation emitted from the plural light sources facing the substrate and exhibiting even illuminance along a width direction of the substrate to form a gas barrier layer, wherein in the UV radiation exposure step, during a period from beginning of vacuum UV radiation exposure to end of the vacuum UV radiation exposure, the surface of the coating film moving relatively to the plural light sources is exposed to the vacuum UV radiation exhibiting an illuminance of not more than 160 mW/cm$^2$; during T period, the surface of the coating film is exposed to the vacuum UV radiation exhibiting an illuminance of not less than 50 mW/cm$^2$ and not more than 160 mW/cm$^2$; and during the T period, the surface of the coating film is exposed to the vacuum UV radiation having an energy amount E1 of not less than 180 mJ/cm$^2$ and not more than 1800 mJ/cm$^2$.

Specifically in the present invention, a gas barrier film exhibiting excellent gas barrier performance can be prepared by a method of delivering vacuum UV radiation exhibiting the above-described specific intensity in the above-described specific amount, and manufactured at high productivity.

In a coating step, a coating solution containing polysilazane is coated on a substrate in the form of a belt (hereinafter, referred to also as a belt-shaped substrate) to form a coating film.

(Substrate)

A substrate used in the present invention is a long-length support; is one which can support a gas barrier layer (also referred to simply as "a barrier layer") exhibiting the after-mentioned gas barrier property (also referred to simply as "a barrier property"); and is formed of the following material, but the substrate is not specifically limited to those described below.

Examples thereof include resin films each made of acrylic acid ester, methacrylic acid ester, polyethylene terephthalate (PET), polybutylene terephthalate, polyethylene naphthalate (PEN), polycarbonate (PC), polyacrylate, polyvinyl chloride (PVC), polyethylene (PE), polypropylene (PP), polystyrene (PS), nylon (Ny), aromatic polyamide, polyetherether ketone, polysulfone, polyethersulfone, polyimide, polyether imide or the like; heat resistant transparent films each having silsesquioxane as a base skeleton, which has an organic inorganic hybrid structure (product name Sila-DEC, produced by Chisso Corporation); resin films each in which at least two layers each made of the foregoing resin are laminated; and so forth.

Polyethylene terephthalate (PET), polybutylene terephthalate, polyethylene naphthalate (PEN), polycarbonate (PC) and so forth are preferably usable in view of coat and commercial availability, and heat resistant transparent films each having silsesquioxane as a base skeleton, which has an organic inorganic hybrid structure are preferably usable in view of optical transparency, heat resistance, adhesion to an inorganic layer, and adhesion to a gas barrier layer.

The substrate preferably has a thickness of roughly 5-500 μm, and more preferably has a thickness of 25-250 μm.

Further, the substrate is preferably transparent.

Herein, the substrate being transparent means that light transmittance at a visible light wavelength of 400-700 nm is more than 80%.

A gas barrier film is possible to be made since the substrate is transparent, and a layer formed on the substrate is also transparent, whereby this enables a transparent substrate for an organic EL element or the like.

Further, the substrate made of each of resins described above may be an unstretched film, or may be a stretched film.

The substrate used in the present invention is possible to be prepared by a commonly known conventional method. For example, a resin as a material can be melted with an extruder, and rapidly cooled after the melted resin is extruded through an annular die or a T die to prepare an unstretched substrate which is substantially amorphous, and is not oriented.

An unstretched substrate is also oriented in the substrate running direction (vertical axis) or in the direction at right angle to the substrate running direction (horizontal axis) by a commonly known method such as a uniaxially stretching method, a tenter type individual biaxially stretching method, a tenter type simultaneous biaxially stretching method or a tubular type simultaneous biaxially stretching method to produce a stretched substrate.

In this case, a stretching magnification is preferably 2-10 times in each of the vertical axis direction and the horizontal axis direction, though the magnification can be selected appropriately to fit a resin as a substrate material.

Further, in order to improve dimension stability of a substrate with respect to a stretched film, a relaxation treatment is preferably conducted after stretching.

The substrate of the present invention may also be subjected to a corona treatment before coating a film thereon. Further, an anchor coating agent layer may be formed on the surface of the substrate of the present invention on the side where a coating film is formed, in order to improve adhesion to the coating film.

<<Anchor Coating Agent Layer>>

Examples of anchor coating agents used for the anchor coating agent layer include a polyester resin, an isocyanate resin, a urethane resin, an acrylic resin, an ethylene vinyl alcohol resin, a vinyl-modified resin, an epoxy resin, a modified styrene resin, a modified silicon resin, alkyl titanate and so forth, and these may be used singly or in combination with at least two kinds thereof.

Commonly known conventional additives can be added into each of these anchor coating agents. The above-described anchor coating agent can be coated on a support by a commonly known method such as a roll coating method, a gravure coating method, a knife coating method, a dip coating method, a spray coating method or the like, and a solvent, a diluent and so forth are removed therefrom via drying to conduct anchor coating. A coating amount of the above-described anchor coating agent is preferably about 0.1-5 g/m$^2$ under the dry condition.

<<Flat and Smooth Layer>>

A flat and smooth layer may be formed between a substrate and a gas barrier layer in a gas barrier film of the present invention. The roughened surface of a transparent resin film support on which protrusions are present is planarized with a flat and smooth layer used in the present invention, or asperity and pinholes produced on a transparent inorganic compound layer, which are caused by protrusions present on a transparent resin film support are smoothed and planarized by the flat and smooth layer. Such a flat and smooth layer is prepared by basically curing a photosensitive resin.

Examples of the photosensitive resin constituting the flat and smooth layer include a resin composition containing an acrylate compound possessing a radical reactive unsaturated compound, a resin composition containing a mercapto compound possessing an acrylate compound and a thiol group, a resin composite obtained by dissolving a polyfunctional acrylate monomer such as epoxy acrylate, urethane acrylate, polyester acrylate, polyether acrylate, polyethylene glycol acrylate, glycerol methacrylate or the like, and so forth.

Further, any admixture of the above-described resin compositions is possible to be used, and the resin is not specifically limited as long as it is a photosensitive resin containing a reactive monomer having at least one photo-polymerizable unsaturated bond in the molecule.

A method of forming a flat and smooth layer is not specifically limited, but the flat and smooth layer is preferably formed by a wet coating method such as a spray method, a blade coating method, a dip method or the like, or a dry coating method such as an evaporation method or the like.

As to formation of a flat and smooth layer, additives such as an antioxidant, a UV absorbent, a plasticizer can be added into the above-described photosensitive resin, if desired. Regardless of the location where the flat and smooth layer is contaminated, an appropriate resin or additives may be used for any of additives in order to improve a film-formation property, and to suppress generation of pinholes.

Smooth flatness of the flat and smooth layer is a value expressed by surface roughness specified by JIS B 0601, and the flat and smooth layer preferably has a maximum cross-section height Rt(p) of 10-30 nm. In the case of the value smaller than this range, coatability is often deteriorated when a coating device is brought into contact with the surface of the flat and smooth layer in a coating system such as a wire bar, a wireless bar or the like at the stage where the after-mentioned silicon compound is coated. Further, in the case of the value larger than this range, asperity produced after coating the silicon compound tends to be difficult to be smoothed.

<<Bleed-Out Protection Layer>>

The gas barrier film of the present invention may form a bleed-out protection layer on the side opposite to a flat and smooth layer of a substrate.

Bleed-out protection layer is provided on the opposite surface of a substrate on which a flat and smooth layer is provided for the purpose of suppressing a phenomenon in which an unreacted oligomer and so forth is moved to the surface from the inside of a film support when heating a film in which the flat and smooth layer is provided, whereby the contact surface is to be contaminated. Basically, the breed-out protection layer may take the same structure as that of the flat and smooth layer, as long as this is serving as a function.

Examples of unsaturated organic compounds each having a polymerizable unsaturated group which is possible to be contained in the bleed-out protection layer include a polyvalent unsaturated organic compound having at least two polymerizable unsaturated groups in the molecule, a monovalent unsaturated organic compound having one polymerizable unsaturated group in the molecule, and so forth.

As other additives, a mat agent may be contained. As a mat agent, preferable are inorganic particles each having an average particle diameter of roughly 0.1-5 µm. Examples of such an inorganic particles include silica, alumina, talc, clay, calcium carbonate, magnesium carbonate, barium sulfate, aluminum hydroxide, titanium dioxide, zirconium oxide and so forth, and these may be used singly, or in combination with at least two kinds thereof.

Herein, the mat agent composed of inorganic particles is desirably mixed to have a content of at least 2 parts by weight; preferably at least 4 parts by weight; and more preferably at least 6 parts by weight, but to have not more than 20 parts by weight; preferably not more than 18 parts by weight; and more preferably 16 parts by weight, based on 100 parts by weight of a hard coat agent in terms of a solid content.

Further, examples of other components for the hard coat agent and the mat agent contained in the bleed-out protection layer include a thermoplastic resin, a thermosetting resin, an ionizing radiation-curable resin, a photo-polymerization initiator and so forth.

After a hard coat agent, a mat agent, and another component, if desired are blended, and the resulting coating solution is coated on the surface of a support film by commonly known conventional coating method via preparation thereof as a coating solution employing a diluted solvent appropriately used if desired, the resulting system is exposed to ionizing radiation to form a bleed-out protection layer as described above.

In addition, an ionizing radiation exposure method can be conducted by delivering UV radiation having a wavelength range of 100-400 nm, and preferably a wavelength range of 200-400 nm emitted from an ultrahigh pressure mercury lamp, a high pressure mercury lamp, a low pressure mercury lamp, a carbon-arc lamp, a metal halide lamp or the like, or by delivering electron beam having a wavelength range of 100 nm or less emitted from a scanning type or curtain-type electron beam accelerator.

The bleed-out protection layer preferably has a thickness of 1-10 µm, and more preferably has a thickness of 2-7 µm in order to improve heat resistance to a film, to make optical properties to be easily balance-adjusted, and to suppress curling produced when a bleed-out protection layer is provided only on one surface of a gas barrier film.

(Coating Solution Containing Polysilazane Compound)

A coating solution containing a polysilazane compound is coated on a substrate in the form of a belt to form a coating solution of the present invention.

Any of appropriate methods is usable as a coating method.

Specific examples thereof include a roll coating method, a flow coating method, an ink-jet method, a spray coating method, a cast film-forming method a bar coating method, a gravure printing method and so forth.

Thickness of the coating film is appropriately adjusted depending on the purpose. For example, the coating film is adjustable so as to preferably have an approximate dry thickness of 1 nm to 10 µm; more preferably have an approximate dry thickness of 10 nm to 10 µm; and most preferable have an approximate dry thickness of 30 nm to 1 µm.

"Polysilazane compound" used in the present invention is a polymer having a silicon-nitrogen bond, which is a ceramic precursor polymer such as an intermediate solid solution $SiO_xN_y$ of $SiO_2$, $Si_3N_4$ or both of them formed from Si—N, Si—H, N—H or the like.

In order to coat it in such a way that a film substrate is not deteriorated, it is preferably ceramic-formed at considerably low temperature as described in Japanese Patent O.P.I. Publication No. 8-112879 to form a compound of modifying it into silica.

As a compound of modifying it into silica, preferably used is one having the following structure.

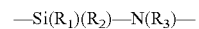

—Si($R_1$)($R_2$)—N($R_3$)— where each of $R_1$, $R_2$ and $R_3$ represents a hydrogen atom, an alkyl group, an alkenyl group, a cycloalkyl group, an aryl group, an alkenyl group, an alkylamino group or an alkoxy group.

In the present invention, perhydropolysilazane in which all of $R_1$, $R_2$ and $R_3$ are hydrogen atoms is preferable in view of a film-dense property of the resulting gas barrier layer.

Organopolysilazane in which hydrogen portions bonded to Si thereof has the advantage that adhesion to a subbing layer is improved via possession of an alkyl group such as a methyl group or the like in the organopolysilazane; toughness can be added to a ceramic film produced by hard and brittle polysilazane; and generation of cracks is suppressed even though designing thickness of a thicker film.

These perhydrosilazane and organopolysilazane may be approximately selected depending on the application, and may be used as a mixture of them.

Perhydrosilazane preferably has a structure in which a straight chain structure and a cyclic structure mainly having six and eight-membered rings are present.

The molecular weight is a number average molecular weight of approximately 600-2000 in terms of polystyrene conversion, and the foregoing material is composed of liquid or solid though depending on molecular weight.

This is commercially available in the state of a solution dissolved in an organic solvent, and the commercially available product is usable as it is, as a polysilazane-containing coating solution.

Examples of polysilazane compounds each ceramic-formed at low temperature include silicon alkoxide-addition polysilazane obtained via reaction of silicon alkoxide with the above-described polysilazane (disclosed in Japanese Patent O.P.I. Publication No. 5-238827); glycidol-addition polysilazane obtained via reaction of glycidol (disclosed in Japanese Patent O.P.I. Publication No. 6-122852); alcohol-addition polysilazane obtained via reaction of alcohol (disclosed in Japanese Patent O.P.I. Publication No. 6-240208); metal carboxylate-addition polysilazane obtained via reaction of metal carboxylate (disclosed in Japanese Patent O.P.I. Publication No. 6-299118); acetylacetonate complex-addition polysilazane obtained via reaction of acetylacetonate complex containing metal (disclosed in Japanese Patent O.P.I. Publication No. 6-306329); metal particle-addition polysilazane obtained via addition of metal particles (disclosed in Japanese Patent O.P.I. Publication No. 7-196986); and so forth.

Those containing alcohol or water to be easily reacted with polysilazane are not preferably used as an organic solvent to prepare a coating solution containing a polysilazane compound.

Specifically usable examples thereof include hydrocarbon solvents such as aliphatic hydrocarbon, cyclic hydrocarbon, aromatic hydrocarbon and so forth; halogenated hydrocarbon solvents; and ethers such as aliphatic ether, cyclic ether and so forth.

Specific examples of hydrocarbons include pentane, hexane, cyclohexane, toluene, xylene, solvesso, turpentine, and so forth; specific examples of halogenated hydrocarbons include methylene, chloride, trichloroethane and so forth; and specific examples of ethers include dibutylether, dioxane, tetrahydrofuran and so forth.

These solvents are selected depending on the purposes of solubility of polysilazane, vaporization speed of a solvent and so forth, and a plurality of solvents may be mixed.

A polysilazane compound in a polysilazane compound-containing coating solution approximately has a content of 0.2-35% by weight, depending on targeted thickness of a gas barrier layer and pot life of a coating solution.

The polysilazane compound may be a derivative in which hydrogen portions each bonded to Si thereof partially are substituted with alkyl groups.

Since adhesion to a subbing layer is improved via possession of a methyl group having the least molecular weight, and toughness can be added to a hard and brittle silica film, generation of cracks is suppressed even though designing thickness of a thicker film.

In order to accelerate modification to a silicon oxide compound, added can be an amine or metal catalyst. Specific examples thereof include AQUAMICA NAX 120-20, AQUAMICA NH 110, AQUAMICA NH 310, AQUAMICA NH 320, AQUAMICA NL 110A, AQUAMICA NL 120A, AQUAMICA NL 150A, AQUAMICA NP 110, AQUAMICA NP 140, AQUAMICA SP 140 and so forth, which are produced by AZ Electronic Materials Co., Ltd.

A reactive catalyst may be added in a coating solution containing a polysilazane compound, if desired, but an addition amount of a catalyst is preferably adjusted to 2% by weight, based on the weight of a polysilazane compound in order to avoid excessive formation of silanol caused by the catalyst, and to avoid decline of film density and increase of film defects.

(UV Radiation Exposure Step)

As the UV radiation exposure step, at least a part of polysilazane is converted into silicon oxide to form a gas barrier layer containing silicon oxide at the UV radiation exposure step in which a coating film containing polysilazane is exposed to vacuum UV radiation.

In the UV radiation exposure step, a substrate on which a coating film is formed is moved relatively to plural light sources of vacuum UV radiation (VUV), and the coating film is exposed to the vacuum UV radiation emitted from the plural light sources facing the substrate and exhibiting even illuminance along the width direction of the substrate to form a gas barrier layer.

Also in the UV radiation exposure step, during a period from beginning of vacuum UV radiation exposure to end of the vacuum UV radiation exposure, the surface of the coating film moving relatively to the plural light sources is exposed to the vacuum UV radiation exhibiting an illuminance of not more than 160 mW/cm$^2$; during T period, the surface of the coating film is exposed to the vacuum UV radiation exhibiting an illuminance of not less than 50 mW/cm$^2$ and not more than 160 mW/cm$^2$; and during the T period, the surface of the coating film is exposed to the vacuum UV radiation having an energy amount E1 of not less than 180 mJ/cm$^2$ and not more than 1800 mJ/cm$^2$.

In the present invention, plural light sources of UV radiation each facing a substrate are provided, and plural light sources each exhibit even illuminance along the width direction of the substrate.

"Exhibiting even illuminance along the width direction of a substrate" means "exhibiting even illuminance on a straight line along the direction from one point of one side along the belt-shaped longitudinal direction to one point of another side.

An angle made by the straight line and a line parallel to the longitudinal direction is preferably 80° to 90°, and more preferably 90°.

"Even illuminance" means that a distribution of illuminance from one side to another side is within±10%.

The distance from the light source to the surface on which a coating solution is coated has been measured in advance, and illuminance at the distance from the light source of vacuum UV radiation is measured under the environment of the UV radiation exposure step to measure illuminance on the surface of the coating film.

A distribution of illuminance within±10% means that illuminance is measured at each of 10 points obtained by splitting the length from one side to another side into nine equal parts, and the difference between the mean value obtained from those at points and the value at each point is within 10% of the mean value.

Illuminance is measured employing a 172 nm sensor head and a UV integral light counter (C8026/H8025 UV POWER METER, manufactured by Hamamatsu Photonics K.K. As to the measurement, the distance between the surface of a light source lamp tube and the measuring surface of a sensor head can be set to a predetermined value, and prepared is a jig for exclusive use capable of filling nitrogen in such a way that an atmosphere between the surface of the lamp tube and the measuring surface of the sensor head reached the same oxygen concentration as in the UV exposure step to conduct measurements with this jig.

Specifically, vacuum UV radiation having a wavelength of 100-200 nm is preferably used as vacuum UV radiation of the present invention. The vacuum UV radiation exposure is effective even though the UV radiation exposure step is conducted at any time-point after formation of a coating film.

In the UV radiation exposure step, a substrate on which a coating film is formed is moved relatively to light sources, but preferably used is a method by which a substrate in the form of a belt is moved (transported) in the longitudinal direction with respect to the light sources each of which position is fixed.

It is preferred that the moving speed (transporting speed) is generally in the range of 0.2 m/rain to 100 m/min, and it is more preferred that the moving speed (transporting speed) is in the range of 0.5 m/min to 50 m/min.

In the UV radiation exposure step, during a period from beginning of vacuum UV radiation exposure to end of the vacuum UV radiation exposure, the surface of the coating film moving relatively to the plural light sources is exposed to the vacuum UV radiation exhibiting an illuminance of not more than 160 mW/cm$^2$; during T period, the surface of the coating film is exposed to the vacuum UV radiation exhibiting an illuminance of not less than 50 mW/cm$^2$ and not more than 160 mW/cm$^2$; and during the T period, the surface of the coating film is exposed to the vacuum UV radiation having an energy amount of E1 of not less than 180 mJ/cm$^2$ and not more than 1800 mJ/cm$^2$.

In the present invention, a gas barrier layer exhibiting an excellent gas barrier property can be obtained by giving an energy of not less than 180 mJ/cm$^2$ and not more than 1800 mJ/cm$^2$ to the coating film at an illuminance of not less than 50 mW/cm$^2$ and not more than 160 mW/cm$^2$.

In the case of illuminance exceeding 160 mW/cm$^2$, or energy amount E1 exceeding 1800 mJ/cm$^2$, it appears that a part in which UV radiation exposure contributes to reaction to form silicon oxide is reduced, and another part of UV radiation to damage a film is increased, whereby the gas barrier function is degraded.

The reason why the gas barrier property is extremely improved via exposure at illuminance of the present invention is not clear, but the following speculation can be made.

Since the oxidizing reaction by which a bond having silicon in a silazane compound is broken is more evenly conducted in the coating film in the illuminance range of the present invention, and heat generated by reaction is appropriate, volume change of the coating film caused by reaction and heat thereof is more evenly made, and deformation of the substrate caused by heat is protected. For this reason, it is presumably because generation of cracks and so forth are protected.

As described above, it is also presumably because a gas barrier layer exhibiting very much excellent gas barrier performance can not be obtained even though exposure thereof in conducted in the lower illuminance range than that of the present invention so as to make the energy amount to be the same.

That is, contribution to formation of an excellent gas barrier layer via energy upon exposure received during a period excluding the foregoing T period is very small.

And, a ratio of E2/E1 is preferably more than 0 and not more than 0.25, provided that during the period excluding the T period, the surface of the coating film is exposed to the vacuum UV radiation having an energy amount E2.

In addition, when the T period is not present, E2 is one in which exposure energy received in the UV radiation exposure step is integrated.

The T period is a period of exposure at not less than 50 mW/cm$^2$, but a ratio of the T period to the total period of Z in the UV radiation exposure step is preferably not less than 30%, and more preferably not less than 70% in view of gas barrier performance and productivity.

Herein, the time in the total period of Z in the UV radiation exposure step means time having been measured in such a way that a time when the UV radiation emitted on the coating film surface, to which the coating film is subjected at the beginning in the UV radiation exposure step reaches an illuminance of 0.1 mW/cm$^2$ or more is set as a starting point, and another time when the UV radiation emitted on the coating film surface, to which the coating film is subjected at the end in the UV radiation exposure step becomes an illuminance of less than 0.1 mW/cm$^2$ is set as an end point.

In such a way, an embodiment in which the ratio of the T period to the total period is increased is obtained by reducing each distance between line light sources among plural light sources along a line in the width direction.

As a vacuum UV radiation exposure apparatus used for vacuum UV radiation exposure, usable is a commercially available lamp (manufactured by M.D. Excimer, Inc. or USHIO INC., for example).

FIG. 1 is a schematic cross-sectional view showing an example of a vacuum UV radiation exposure apparatus employed in a manufacturing method according the present invention.

Substrate 1 on which a coating film is provided is transported in the direction of an arrow while it is guided with temperature-adjustable back roll 5, and exposed to vacuum UV radiation emitted from excimer lamp 2 facing substrate 1 to be transported.

Excimer lamp 2 is supported by excimer lamp supporting member 3 serving as an external electrode in irradiation chamber 4.

The exposure condition of the present invention can be achieved by appropriately adjusting kinds of lamps, the number of lamps, installation intervals of lamps, distance between the lamp and the surface exposed to UV radiation, concentration of oxygen as an exposure atmosphere and so forth.

The vacuum UV radiation is preferably usable since it has larger interatomic bonding force than that of each of most of substances and the interatomic bond is possible to be directly broken via action of only photon called a photon process.

A film containing silicon oxide at low temperature by using this action.

As a vacuum UV radiation source, preferably usable is a rare gas excimer lamp.

Rare gas atoms such as Xe, Kr, Ar, Ne and so forth called inert gases, since they do not produce molecules via chemical bonding.

However, a rare gas atom in which energy is acquired via discharge or the like (excited atom) can produce molecules via bonding of other atoms. When the rare gas is Xenon, the following are made.

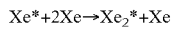

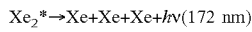

When $Xe_2^*$ as an excited excimer molecule is transited to the ground state, excimer light having a wavelength of 172 nm is emitted.

It is a feature that high efficiency is obtained since radiation concentrates on one wavelength, and those excluding necessary light are not mostly emitted. Further, since extra light is not emitted, temperature of an object can be maintained at a low temperature. Furthermore, since time is not consumed for starting·restarting, instant lighting or flashing is possible.

In order to obtain excimer light emission, known is a method employing dielectric barrier discharge. The dielectric barrier discharge is discharge called very fine micro discharge similar to thunder generated in a gas space by applying voltage having a high frequency of several tens of kHz to electrodes, when the gas space is provided between both the electrodes via a dielectric (transparent quartz in the case of an excimer lamp), and the micro discharge disappears since charge remains on the surface of the dielectric when a streamer of the micro discharge reaches a tube wall (dielectric).

The micro discharge is expanded to the entire tube wall, and is discharge in which generation disappearance is repeated. For this reason, flicker of light observed by the naked eye is produced. Further, deterioration of the tube wall is possible to be accelerated since a streamer at very high temperature locally reaches the tube wall directly.

A method of effectively acquiring excimer light emission is also possible to be conducted via electrodeless electric field discharge other than dielectric barrier discharge. It is electrodeless electric field discharge conducted via capacitive bonding called RF discharge as another name. Lamps, electrodes and their installation may be basically in the same situation as in the dielectric barrier discharge, but high frequency applied between both electrodes is turned on at several MHz. A long-life lamp exhibiting no flicker can be obtained since electrodeless electric field discharge produces uniform discharge spacially and temporally in this way.

In the case of the dielectric barrier discharge, since micro discharge is generated between electrodes, an electrode on the outer side has to be one covering the entire external surface to conduct discharge in the entire discharge space, and transmitting light to derive light to the outside.

For this reason, an electrode in which thin metal wires are reticulated is used. Since a wire being as thin as possible is used in such a way that this electrode blocks light, it is easily damaged in oxygen atmosphere by ozone or the like produced via vacuum UV radiation.

In order to protect this, the inside of an exposure apparatus, that is; circumference of a lamp is filled with inert gas such as nitrogen or the like, a synthetic quartz window is desired to be provided to take light out. Not only the synthetic quartz window is a consumable item, but also loss of light is generated.

Since a dual cylindrical lamp has an outer diameter of roughly 25 mm, difference of the distance up to the surface to be exposed to light can not be neglected at the portion immediately below the lamp axis and on the side surface of the lamp, whereby large difference in illuminance occurs. Accordingly, even though the lamp is attached thereto, no uniform illuminance distribution is obtained. When an exposure apparatus equipped with a synthetic quartz window is used, this can make the distance in oxygen atmosphere to be uniform, whereby a uniform illuminance distribution is obtained.

In cases where an electrodeless electric field discharge is used, no external electrode in which thin metal wires are reticulated needs to be used. Glow discharge is expanded to the entire discharge space by only providing an external electrode on a part of the outer surface of a lamp. An electrode generally serving as a light reflection plate formed from aluminum blocks is used as an external electrode on the back surface of the lamp. However, synthetic quartz should be used in order to realize a uniform illuminance distribution, since the outer diameter of the lamp is large similarly to the case of dielectric barrier discharge.

It is the most distinctive feature that a narrow tube excimer lamp has a simple structure. Both ends of a quartz tube are closed, and gas to conduct excimer emission is only introduced into the inside of the tube.

The narrow tube lamp has a tube outer diameter of approximately 6 nm to 12 mm, but when the tube outer diameter is too large, high voltage needs be applied thereto at the beginning of operation.

As an embodiment of discharge, usable is any of dielectric barrier discharge and electroleless electric field discharge. As to shape of an electrode, the surface brought into contact with a lamp may be the plane, but in the case of shape designed for the curved surface of a lamp, the lamp can be firmly secured, and the electrode is closely attached onto the lamp, whereby discharge becomes more stable. Further, when the curved surface is replaced by the mirror surface employing aluminum, the mirror surface becomes a reflection plate.

Since a Xe excimer lamp emits UV radiation having a short wavelength of 172 nm as a single wavelength, it exhibits excellent emission efficiency. Since this light has a large absorption coefficient of oxygen, radical oxygen atomic species and ozone can be generated at high concentration, employing a small amount of oxygen.

Further, it is known that light energy having a short wavelength of 172 nm to dissociate bonding of an organic substance exhibits high ability.

It can be realized that a polysilazane layer is modified in a short duration via these by these active oxygen and ozone together with high energy possessed by UV radiation.

Accordingly, reduction of processing time along with high throughput, reduction of installation area, and exposing an organic substance and a plastic substrate or the like easily to be damaged via heat, to light become possible in comparison with a low pressure mercury lamp having a wavelength of 185 nm or 254 nm, and plasma cleaning.

Since an excimer lamp has high light generation efficiency, it is possible to be turned on via application of low electric power. Further, light having a long wavelength as a cause of temperature rise produced by light is not emitted, and since exposure to energy is made at a single wavelength in the UV radiation region, it is a feature of the excimer lamp that rise of temperature of the surface of an object to be exposed is suppressed.

[Oxygen Concentration During Exposure to Vacuum UV Radiation (UVU)]

Oxygen is used for reaction during exposure UV radiation, but vacuum UV radiation easily reduces efficiency in the UV radiation exposure step since absorption caused by oxygen occurs. For this reason, exposure to vacuum UV radiation is preferably conducted at lower oxygen concentration.

Oxygen concentration during exposure to vacuum UV radiation (VUV) relating to the present invention is preferably 10-10000 ppm (1%), and more preferably 50-5000 ppm.

Gas satisfying atmosphere for exposure used during exposure thereof to vacuum UV radiation is preferably dry inactive gas, and is more preferably dry nitrogen gas specifically in view of cost. Oxygen concentration is possible to be adjusted by measuring a flow rate of oxygen gas introduced into an exposure chamber, and another flow rate of inactive gas to vary a ratio of the flow rates.

(Overcoat Layer)

An overcoat layer may be formed on a gas barrier layer of the present invention.

(Material to be Used for Overcoat Layer)

Preferably usable examples of an organic material to be used for an overcoat layer include organic resins such as organic monomers, oligomers, polymers and so forth. These organic resins each preferably has a polymerizable group and a crosslinking group, and a layer formed via coating of an organic resin composition coating solution containing the organic resin, and a polymerization initiator and a crosslinking agent, if desired, is preferably subjected to a light exposure treatment or a heat treatment for curing. Herein, "crosslinking group" means a group capable of crosslinking a binder polymer via chemical reaction produced by a light exposure treatment or a heat treatment. The chemical structure is not specifically limited, as long as the group is one exhibiting such a function, but examples of an additionally polymerizable functional group include an ethylenically unsaturated group and a cyclic ether group of an epoxy group/an oxetanyl group and so forth. Further, it may be a functional group capable of being radical via light exposure, and examples of such a crosslinking group include a thiol group, a halogen atom, an onium salt structure and so forth. Of these, an ethylenically unsaturated group is preferable, and includes a functional group described in paragraphs [0130]-[0139] of Japanese Patent O.P.I. (Open to Public Inspection) Publication No. 2007-17948.

Elastic modulus of the overcoat layer can be adjusted to the desired value by appropriately adjusting a structure of an organic resin, a density of a polymerizable group, a density of a crosslinking group, a ratio of a crosslinking agent, a curing condition and so forth.

Specific examples of the organic composition include resin compositions each in which a polyfunctional acrylate monomer such as a resin composition containing an acrylate compound possessing a radically reactive unsaturated compound, a resin composition containing a mercapto compound possessing an acrylate compound and a thiol group, epoxy acrylate, urethane acrylate, polyester acrylate, polyether acrylate, polyethylene glycol acrylate, glycerol methacrylate or the like is dissolved; and so forth. Further, any mixture of the above-described resin compositions is possible to be used, and the present invention is not limited thereto, as long as the photosensitive resin is one containing a reactive monomer possessing at least one photo-polymerizable unsaturated bond in the molecule.

Examples of a reactive monomer having at least one photo-polymerization unsaturated bond in the molecule include methylacrylate, ethylacrylate, n-propylacrylate, isopropylacrylate, n-butylacrylate, isobutylacrylate, tert-butylacrylate, n-pentylacrylate, n-hexylacrylate, 2-ethylhexylacrylate, n-octylacrylate, n-decylacrylate, hydroxyethylacrylate, hydroxypropylacrylate, allylacrylate, benzylacrylate, butoxyethylacrylate, butoxyethylene glycolacrylate, cyclohexylacrylate, dicyclopenthanilacrylate, 2-ethylhexylacrylate, glycerol acrylate, glycidyl acrylate, 2-hydroxyethylacrylate, 2-hydroxypropylacrylate, isobonylacrylate, isodexsilacrylate, isooctylacrylate, laurylacrylate, 2-methoxyethylacrylate, methoxyethylene glycolacrylate, phonoxyethylacrylate, stearylacrylate, ethylene glycol acrylate, diethylene glycol diacrylate, 4-buthane diol diacrylate, 1,5-pentane diol diacrylate, 1,6-hexane diol diacrylate, 1,3-propane diol acrylate, 1,4-cyclohexane diol diacrylate, 2,2-dimethylol propane diacrylate, glycerol diacrylate, tripropylene glycol diacrylate, glycerol triacrylate, trimethylol propane triacrylate, polyoxyethyltrimethylol propane triacrylate, pentaerythritol triacrylate, pentaerythritol tetraacrylate, ethylene oxide modified pentaerythritol triacrylate, ethylene oxide modified pentaerythritol tetraacrylate, propion oxide modified pentaerythritol triacrylate, propion oxide modified pentaerythritol tetraacrylate, triethylene glycol diacrylate, polyoxypropyltrimethylol propane triacrylate, butylenes glycol diacrylate, 1,2,4-butane diol triacrylate, 2,2,4-trimethyl-1,3-pentadiol diacrylate, diallyl fumarate, 1,10-decane diol dimethyl acrylate, pentaerythritol hexaacrylate, those each in which the above-described acrylate is replaced by methacrylate, γ-methacryloxypropyltrimethoxy silane, 1-vinyl-2-pyrrolidone, and so forth. The above-described reactive monomers may be used singly, or in combination with at least two kinds as a mixture. They may be also used as a mixture in combination with a compound other than those described above.

The composition of the foregoing photosensitive resin contains a photo-polymerization initiator. Examples of the photo-polymerization initiator include benzophenone, o-benzoyl methyl benzoate, 4,4-bis(dimethyl amine)benzophenone, 4,4-bis(diethyl amine)benzophenone, α-amino acetophenone, 4,4-dichlorobenzophenone, 4-benzoyl-4-methyldiphenyl ketone, dibenzil ketone, fluorenone, 2,2-diethoxy acetophenone, 2,2-dimethoxy-2-phenyl acetophenone, 2-hydroxy-2-methylpropiophenone, p-tert-butyldichloroacetophenone, thioxanthone, 2-methyl thioxanthone, 2-chloro thioxanthone, 2-isopropyl thioxanthone, diethyl thioxanthone, benzildimethyl ketal, benzylmethoxyethyl acetal, benzoinmethyl ether, benzoinbutyl ether, anthraquinone, 2-tert-butyl anthraquinone, 2-amyl anthraquinone, β-chloranthraquinone, anthrone, benzanthrone, dibenzsuberon, methylene anthrone, 4-azidobenzil acetophenone, 2,6-bis(p-azidobenzylidene)cyclohexane, 2,6-bis(p-azidobenzylidene)-4-methylcyclohexane, 2-phenyl-1,2-butadiene-2-(o-methoxycarbonyl)oxime, 1-phenyl-propanedione-2-(o-methoxycarbonyl)oxime, 1-phenyl-propanedione-2-(o-ethoxycarbonyl) oxime, 1,3-diphenyl-propanetrione-2-(o-ethoxycarbonyl)oxime, 1-phenyl-3-ethoxy-propanetrione-2-(o-benzoyl)oxime, michler ketone, 2-methyl[4-(methylthio)phenyl]-2-monopholino-1-propane, 2-benzil-2-dimethylamino-1-(4monopholinophenyl9-butane-1, naphthalene sulfonyl chloride, quinoline sulfonyl chloride, n-phenylthioacridone, 4,4-azobisisobutyronitrile, diphenyl disulfide, benzothiazole disulfide, triphenyl phosphine, Camphorquinone, carbon tetrabromide, tribromophenyl sulfone, benzoin peroxide, eosin, those in which a photo-reducing dye such as methylene blue or the like is used in combination with a reducing agent such an ascorbic acid, triethanol amine or the like, and so forth. These photo-polymerization initiators may be used singly, or in combination with at least two kinds thereof.

An organic material can be contained in an overcoat layer. Elastic modulus of the overcoat layer is to be increased generally by containing an inorganic material. Elastic modulus of the overcoat layer can be adjusted to the desired value by appropriately adjusting a content ratio of the inorganic material.

As for the inorganic material, preferable are inorganic particles having a number average particle diameter of 1-200 nm, and more preferable are inorganic particles having a number average particle diameter of 3-100 nm. The inorganic particles each are preferably made of metal oxide in view of transparency.

The metal oxide is not specifically limited, and examples thereof include $SiO_2$, $Al_2O_3$, $TiO_2$, $ZrO_2$, ZnO, $SnO_2$, $In_2O_3$, BaO, SrO, CaO, MgO, $VO_2$, $V_2O_5$, $CrO_2$, $MoO_2$, $MoO_3$, $MnO_2$, $Mn_2O_3$, $WO_3$, $LiMn_2O_4$, $Cd_2SnO_4$, $CdIn_2O_4$, $Zn_2SnO_4$, $ZnSnO_3$, $Zn_2In_2O_5$, $Cd_2SnO_4$, $CdIn_2O_4$, $Zn_2SnO_4$, $ZnSnO_3$, $Zn_2In_2O_5$ and so forth. These may be used singly, or in combination with at least two kinds thereof.

It may be adjusted in the track of recent scientific papers to obtain a dispersion of inorganic particles, but a commercially available inorganic particle dispersion is also preferably usable.

Specific examples thereof include various metal oxides such as Snowtex series and Organosilica sol produced by Nissan Chemical Industries, Ltd., NANOBYK series produced by BYK Japan KK, NanoDur produced by Nanophase Technologies Corporation, and so forth.

These inorganic particles having been subjected to a surface treatment are also usable.

Usable examples of inorganic material include plate-shaped particles such as mica selected from natural mica, synthetic mica and so forth; talc represented by a formula of $3MgO.4SiO.H_2O$, teniolite; montmorillonite; saponite; hectorite; zirconium phosphate; and so forth.

Specific examples of the above-described natural mica include white mica, soda mica, brown mica, black mica and lepidolite. Further, examples of the synthetic mica include nonswelling mica such as fluoride brown mica {for example, $KMg_3$ $(AlSi_3O_{10})F_2$} and potassium fluosilicate {for example, $KMg_{2.5}(Si_4O_{10})$ $F_2$ or the like}; and swelling mica such as Na tetrasilylic mica (for example, $NaMg_{2.5}(Si_4O_{10})$ $F_2$, Na taeniolite (Na, Li) $Mg_2Li$ $(Si_4O_{10})$ $F_2$ or Li taeniolite (Na, Li) $Mg_2Li$ $(Si_4O_{10})$ $F_2$) and a montmorillonite type (for example, Na hectorite $(Na, Li)_{1/8}Mg_{2/5}Li_{1/8}(Si_4O_{10})$ $F_2$ or Li hectorite $(Na, Li)_{1/8}Mg_{2/5}Li_{1/8}(Si_4O_{10})F_2$). Further, synthetic smectite is also usable.

An inorganic material in an overcoat layer preferably has a content of 10-95% by weight, based on the total weight of the overcoat layer, and more preferably has a content of 20-90% by weight, based on the total weight of the overcoat layer.

After the foregoing organic resin and inorganic material, and another component, if desired are blended, and the resulting coating solution is coated on the surface of a substrate by commonly known conventional coating method via preparation thereof as a coating solution employing a diluted solvent appropriately used if desired, the resulting system is exposed to ionizing radiation to form an overcoat layer. In addition, an ionizing radiation exposure method can be conducted by delivering UV radiation having a wavelength range of 100-400 nm, and preferably a wavelength range of 200-400 nm emitted from an ultrahigh pressure mercury lamp, a high pressure mercury lamp, a low pressure mercury lamp, a carbon-arc lamp, a metal halide lamp or the like, or by delivering electron beam having a wavelength range of 100 nm r or less emitted from a scanning type or curtain-type electron beam accelerator.

(Application of Gas Barrier Film)

Gas barrier films of the present invention are applicable mainly for package of electronic devices and so forth, or for gas barrier films used for display material such as an organic EL element, a solar cell, and a plastic substrate provided for liquid crystal, and for resin substrates used for various devices each in which a gas barrier film is provided and various device elements.

The gas barrier film of the present invention is preferably applicable as each of various sealing materials and films.

A device element in which a gas barrier film of the present invention is provided will be described as an example for an organic photoelectric conversion element.

(Organic Photoelectric Conversion Element)

An organic photoelectric conversion element of the present invention possesses a gas barrier film of the present invention, but when the gas barrier film is utilized in the organic photoelectric conversion element, it is preferably transparent, and this gas barrier film can be designed to be used as a substrate (referred to also as a support) so as to receive sunlight from this side.

That is, a transparent conductive thin film such as ITO or the like as a transparent electrode, for example, is provided on this gas barrier film to constitute a resin support used for an organic photoelectric conversion.

Then, an ITO transparent conductive film provided on a support is used as an anode; a porous semiconductor layer is provided on this anode; and a cathode composed of a metal film is further formed to produce an organic photoelectric conversion element. Another sealing material (the same material is also allowed to be used) is layered on this element, and the foregoing gas barrier film support adheres to circumference thereof to seal the element. Thus, the organic photoelectric conversion element can be sealed. By doing this, the effects of moisture of outside air and gas such as oxygen or the like on the element can be suppressed.

A transparent conductive film is formed on a ceramic layer as a gas barrier film prepared in this way to obtain a resin support for the organic photoelectric conversion element, wherein the ceramic layer means a silicon oxide layer formed via a modifying treatment of a polysilazane layer.

A transparent conductive film can be formed by a vacuum evaporation method, a sputtering method or the like, and also prepared by a coating method such as a sol-gel method employing metal alkoxide of indium, tin or the like, and so forth.

Further, the transparent conductive film is preferably a transparent conductive film having a film thickness of 0.1-1000 nm.

Next, each of organic photoelectric conversion element material layers (constituting layers) constituting an organic photoelectric conversion element will be described.

(Configuration of Organic Photoelectric Conversion Element and Solar Cell)

Preferred embodiments of an organic photoelectric conversion element and a solar cell will be described. In addition, preferred embodiments of an organic photoelectric conversion element and a solar cell will be detailed below, but the solar cell possesses the organic photoelectric conversion element as a constituent, and further, a preferred structure of the solar cell can be similarly described.

The organic photoelectric conversion element is not specifically limited, and may be an element of generating electric current via light-irradiation, in which an anode, a cathode, and at least one power generation layer (referred to also as a layer in which a p-type semiconductor and a n-type semiconductor are mixed; a bulk heterojunction; or an i layer) sandwiched between the anode and the cathode are provided.

Preferred specific examples of layer configuration for an organic photoelectric conversion element will be described below (desirable layer configuration for a solar is also identical to the layer configuration for an organic photoelectric conversion element).

Preferred specific examples of layer configuration for an organic photoelectric conversion element will be described below
(i) anode/power generation layer/cathode
(ii) anode/hole transport layer/power generation layer/cathode
(iii) anode/hole transport layer/power generation layer/electron transport layer/cathode
(iv) anode/hole transport layer/p-type semiconductor layer/power generation layer/n-type semiconductor layer/electron transport layer/cathode
(v) anode/hole transport layer/first power generation layer/electron transport layer/intermediate electrode/hole transport layer/second power generation layer/electron transport layer/cathode Herein, a power generation layer should contain a p-type semiconductor material capable of transporting holes and an n-type semiconductor material capable of transporting electrons. These may be substantially two layers to produce heterojunction, or bulk heterojunction in the state where these are mixed in the inside of a single layer may be prepared, but the bulk heterojunction configuration is preferable since photoelectric conversion efficiency is high. The p-type semiconductor material and the n-type semiconductor material used for a power generation layer will be hereinafter described.

Since similarly to an organic EL element, taking-out efficiency of holes and electrons into anode•cathode can be raised by sandwiching a power generation layer with a hole transport layer and/or an electron transport layer, configuration (ii) or (iii) having such a structure is preferable. Further, since a power generation layer itself enhances rectification of holes and electrons (selectivity to take carrier out), configuration (iv) in which a power generation layer is sandwiched by a layer formed only of a p-type semiconductor material and formed only of an n-type semiconductor material (referred to also as "p-i-n configuration) may be allowed to be used. Further, in order to raise sunlight-use efficiency, tandem configuration (v) in which sunlight having different wavelengths is absorbed by each of power generation layers may be also allowed to be used.

Next, material constituting each of these layers will be described.
(Organic Photoelectric Conversion Element Material)

Material used for formation of a power generation layer (referred to also as "photoelectric conversion layer") in an organic photoelectric conversion element will be described.
(P-Type Semiconductor Material)

As a p-type semiconductor material preferably used as a power generation layer (a bulk heterojunction layer) in an organic photoelectric conversion element, cited are various types of condensed polycyclic aromatic low-molecular weight compounds, and conjugated polymers and oligomers.

Examples of the condensed polycyclic aromatic low molecular weight compounds include: anthracene, tetracene, pentacene, hexacene, heptacene, chrysene, picene, fulminene, pyrene, peropyrene, perylene, terylene, quo-terylene, coronene, ovalene, circumanthracene, bisanthene, zethrene, heptazethrene, pyanthrene, violanthene, isoviolanthene, circobiphenyl, anthradithiophene; porphyrin, copper phthalocyanine; tetrathiafulvalene (TTF)-tetracyanoquinodimethane (TCNQ) complex, bisethylenetetrathiafulvalene (BEDTTTF)-perchloric acid complex; and a derivative of a precursor thereof.

Further, examples of a derivative containing a condensed polycyclic compound include pentacene derivatives having a substituent disclosed in WO 03/16599, WO 03/28125, U.S. Pat. No. 6,690,029, and Japanese Patent O.P.I. Publication No. 2004-107216; pentacene precursors disclosed in US 2003/136964; substituted acenes and their derivatives disclosed in J. Amer. Chem. Soc., vol. 127, No. 14, p. 4986, J. Amer. Chem. Soc., vol. 123, p. 4982, J. Amer. Chem. Soc., vol. 130, No. 9, p. 2706, and so forth.

Examples of a conjugated polymer include polythiophene such as 3-hexylthiohene (P3HT) and its oligomer, polythiophene having a polymerizable group disclosed in Technical Digest of the International PVSEC-17, Fukuoka, Japan, 2007, P. 1225, polythiophene-thienophene copolymer disclosed in Nature Material, Vol. 5, p. 328 (2006), polythiophene-diketopyrrolopyrrole copolymer disclosed in literature of WO 2008/000664, polythiophene-thizolothiazole copolymer disclosed in Adv. Mat., p. 4160 (2007), polythiophene copolymer disclosed in Nature Material, Vol. 6, p. 497 (2007), polypyrrole and its oligomer, poly aniline, polyphenylene and its oligomer, polyphenylene vinylene and its oligomer, poly thienylene vinylene and its oligomer, polyacetylene, polydiacetylene, polysilane, a conjugated polymers such as polygerman and so forth.

Suitably usable oligomers other than polymers are oligomers such as: α-sexithionene, α,ω-dihexyl-α-sexithionene, α,ω-dihexyl-α-quinquethionene, α,ω-bis(3-butoxypropyl)-sexithionene, and so forth as thiophene hexamers.

Of these compounds, preferable are compounds exhibiting high solubility into an organic solvent to such an extent a solution process is able to be possibly conduced, and those capable of achieving high mobility by forming a crystalline thin film after drying.

When an electron transport layer is formed on a power generation layer via a coating process, since there appears a problem such that an electron transport layer solution may dissolve the power generation layer, a material capable of being insoluble may be used after conducting coating by a solution process.

Examples of such a material include a material capable of being insoluble via crosslinking polymerization of a coating film after coating, like thiophene having a polymerizable group which is described in Technical Digest of the International PVSEC-17, Fukuoka, Japan, 2007, p. 1225; another material in which a soluble substituent produces insolubility via reaction (being made into a pigment) by applying energy such as heat or the like as described in the specification of US 2003/136964 and Japanese Patent O.P.I. Publication No. 2008-16834; and so forth.
(N-Type Semiconductor Material)

There is no specific limitation to an n-type semiconductor material used in a bulk heterojunction layer, but examples thereof include fullerene, octaazaporphyrin or the like, a perfluoro compound in which a hydrogen atom in a p-type semiconductor is replaced by a fluorine atom (perfluoropentacene, perfluorophthalocyanine and so forth), aromatic carboxylic acid anhydride such as naphthalene tetracarboxylic anhydride, naphthalene tetracarboxylic diimide, perylene tetracarboxylic anhydride or the like, and a polymeric compound possessing an imide compound thereof as a skeleton, and so forth.

However, preferable is a fullerene derivative capable of effectively conducting charge separation with each of various n-type semiconductor materials at a high speed of 50 fs. Examples of a fullerene derivative include: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, and nano-horn (cone type) and a fullerene derivative a part of which is substituted with a hydrogen atom, a halogen atom, a substituted or unsubstituted alkyl group, alkenyl group, alkynyl group, aryl group, heteroaryl group, cycloalkyl group, silyl group, ether group, thioether group, or amino group.

Of these, preferably usable examples include [6,6]-phenyl $C_{61}$-butyric acid methyl ester (abbreviated name PCBM), [6,6]-phenyl $C_{61}$-butyric acid n-butyl ester (PCBnB), [6,6]-phenyl $C_{61}$-butyric acid isobutyl ester (PCBiB), [6,6]-phenyl $C_{61}$-butyric acid n-hexyl ester (PCBH), bis-PCBM disclosed in Adv. Mater., vol. 20 (2008), p. 2116, aminated fullerene disclosed in Japanese Patent O.P.I. Publication No. 2006-199674, metallocene fullerene disclosed in Japanese Patent O.P.I. Publication No. 2008-130889, and a fullerene derivative which has improved solubility by possessing a substituent such as fullerene and so forth containing a cyclic ether group, disclosed in the specification of U.S. Pat. No. 7,329,709.

(Hole Transport Layer•Electron Block Layer)

An organic photoelectric conversion element of the present invention possesses a hole transport layer provided between a bulk heterojunction layer and an anode, and preferably possesses these layers since charge generated in the bulk heterojunction layer is possible to be more effectively taken out.

Usable examples of material constituting each of these layers for a hole transport layer include PEDOT (Product Name: Baytron P and so forth; produced by Starck-V Tech Co., Ltd.); polyaniline and doped material thereof; a cyan compound disclosed in literature of WO 06/19270; and so forth.

In addition, an electron-blocking function producing a rectification effect in which electrons generated in a bulk heterojunction layer are not flowed on the anode side is provided for a hole transport layer having a shallower LUMO level than an LUMO level of an n-type semiconductor material used for a bulk heterojunction layer.

Such a hole transport layer is called an electron block layer, and it is preferable that a hole transport layer having such a function is used. Usable examples of material thereof include a triarylamine based compound disclosed in Japanese Patent O.P.I. Publication No. 5-271166, and metal oxide such as molybdenum oxide, nickel oxide, tungsten oxide or the like.

Further, usable is a layer which is made only of a p-type semiconductor material used for a bulk heterojunction layer. As a method to prepare these layers, any of a vacuum evaporation method and a solution coating method is allowed to be used, but the solution coating method is preferable. When a coating layer is prepared as a lower layer before preparing a bulk heterojunction layer, there appears an effect by which the coating surface is leveled, and influence caused by leakage and so forth is preferably reduced.

(Electron Transport Layer•Electron Block Layer)

An organic photoelectric conversion element of the present invention possesses an electron transport layer provided between a bulk heterojunction layer and a cathode, and preferably possesses these layers since charge generated in the bulk heterojunction layer is possible to be more effectively taken out.

Further, usable examples of the electron transport layer include octaazaporphyrin, and a perfluoro substance of a p-type semiconductor (perfluoropentacene, perfluorophthalocyanine and so forth), but a hole-blocking function producing a rectification effect in which holes generated in a bulk heterojunction layer are not flowed on the cathode side is similarly provided for an electron transport layer having a deeper HOMO level than an HOMO level of a p-type semiconductor material used for a bulk heterojunction layer.

Such an electron transport layer is called a hole block layer, and it is preferable that a electron transport layer having such a function is used.

Usable examples of material thereof include a phenanthrene based compound such as bathocuproine or the like; n-type semiconductor material such as naphthalene tetracarboxylic acid anhydride, naphthalene tetracarboxylic acid diimide, perylene tetracarboxylic acid anhydride, perylene tetracarboxylic acid diimide or the like; n-type inorganic oxide such as titanium oxide, zinc oxide, gallium oxide or the like; an alkali metal compound such as lithium fluoride, sodium fluoride, cesium fluoride or the like; and so forth.

Further, usable is a layer which is made only of an n-type semiconductor material used for a bulk heterojunction layer. As a method to prepare these layers, any of a vacuum evaporation method and a solution coating method is allowed to be used, but the solution coating method is preferable.

(Other Layers)

In order to improve energy conversion efficiency, and to improve element lifetime, the configuration in which each of various intermediate layers is provided in an element may be allowed to be used. Examples of the intermediate layer include a hole block layer, an electron block layer, a hole injection layer, an electron injection layer, an exciton block layer, a UV absorbent, a light reflection layer, a wavelength conversion layer and so forth.

[Transparent Electrode (the First Electrode)]

A transparent electrode as a cathode or an anode is not limited, and can be selected from element configuration, but the transparent electrode is preferably used as an anode. When being used as an anode, it is preferably an electrode transmitting light having a wavelength of 380-800 nm.

Usable examples of material include transparent conductive metal oxide such as indium tin oxide (ITO), $SnO_2$, ZnO or the like, a metal thin film formed of gold, silver, platinum or the like, metal nanowire, and carbon nanotube.

Also usable are a conductive polymer selected from the group consisting of derivatives of polypyrrole, polyaniline, polythiophene, polythienylenevinylene, polyazulene, polyisothianaphthene, polycarbazole, polyacetylene, polyphenylene, polyphenylenevinylene, polyacene, polyphenylacethylene, polydiacetylene and polynaphthalene. Further, these conductive compounds may be used in combination also to produce a transparent electrode.

[Counter Electrode (Second Electrode)]

The counter electrode may be a single layer as a conductive material layer, but in addition to a material exhibiting conductivity, a resin to support this material may be used in combination. As a conductive material used for a counter electrode, metal, alloy, an electric conductive compound, and a mixture thereof having a small work function of less than 4 eV.

Specific examples of such an electrode material include sodium, a sodium potassium alloy, magnesium, lithium, a magnesium/copper mixture, a magnesium/silver mixture, a magnesium/aluminum mixture, a magnesium/indium mixture, an aluminum/aluminium oxide ($Al_2O_3$) mixture, indium, a lithium/aluminium mixture, a rare earth metal and so forth.

Among these, from the viewpoint of electron taking-out performance and resistance to oxidation, preferable is a mixture of each of these metals and the second metal as a stable metal having a larger work function than that of the foregoing metal such as a magnesium/silver mixture, a magnesium/aluminum mixture, a magnesium/indium mixture, an aluminum/aluminium oxide ($Al_2O_3$) mixture, a lithium/aluminum mixture, aluminium or the like.

A thin film as a counter electrode can be prepared via vacuum evaporation or sputtering of this electrode material. Further, the film thickness is generally selected from the range of 10 nm to 5 μm, and preferably selected from the range of 50 to 200 nm.

When a metallic material is used as a conducting material for a counter electrode, light arriving at the counter electrode side to be reflected is reflected on the first electrode side, and this light is possible to be reused, and absorbed again in the photoelectric conversion layer, whereby photoelectric conversion efficiency is further preferably improved.

Further, a counter electrode may be formed of metal such as gold, silver, copper, platinum, rhodium, ruthenium, aluminium, magnesium and indium, or of nano particles, nanowires or a nano structure material, made of carbon. When it is a dispersion of nanowires, it is preferable that a transparent counter electrode exhibiting high conductivity can be prepared by a coating method.

When making the counter electrode side to be light-transparent, a light-transparent counter electrode can be made by providing a layer formed of a conductive light-transparent material cited in the description of the above-described transparent electrode, after preparing a film made of a conductive material suitable for a counter electrode such as aluminum, aluminum alloy, silver, a silver compound or the like, which has a film thickness of about 1-20 nm.

(Intermediate Electrode)

Further, a material constituting an intermediate electrode used in the case of tandem configuration like layer configuration (v) of the foregoing organic photoelectric conversion element is preferably used for a layer containing a compound exhibiting both transparency and conductivity at the same time, and usable examples of the material used for the foregoing transparent electrode include transparent metal oxide such as ITO, AZO, FTO, titanium oxide or the like, metal constituting a very thin metal layer made of Ag, Al, Au or the like, a material constituting a layer containing nanoparticles nanowires, PEDOT:PSS, conductive polymeric material such as polyaniline or the like, and so forth.

In addition, among the foregoing hole transport layers and electron transport layers, layers appropriately laminated in combination are also those used in combination, which serve as an intermediate electrode (charge recombination layer), and it is preferable that one step of preparing a layer can be omitted by using such a structure.

(Metal Nanowire)

Usable examples of conductive fiber include metal-coated organic or inorganic fiber, conductive metal oxide fiber, metal nanowire, carbon fiber, carbon nanotube and so forth, but metal nanowire is preferable.

The metal nanowire generally means a linear structure made from metal elements as main constituting elements. Specifically, the metal nanowire of the present invention means a linear structure having a diameter of several nanometers.

The metal nanowire preferably has a mean length of 3 μm or more, more preferably has a mean length of 3-500 μm, and most preferably 3-300 μm in order to prepare a long conductive path with a single metal nanowire, and to produce appropriate light scattering performance. In addition, the length preferably has a relative standard deviation of 40% or less.

Further, the average diameter is small in view of transparency, and on the other hand, it is large in view of conductivity. In the present invention, the metal nanowire preferably has an average diameter of 10-300 nm, and more preferably has an average diameter of 30-200 nm. In addition, the diameter preferably has a relative standard deviation of 20% or less.

The metal composition of the metal nanowire is not specifically limited, and can be composed of at least one metal as a noble metal element or less noble metal element, but preferably contains at least one metal selected from the group of consisting of noble metals such as gold, platinum, silver, palladium, rhodium, iridium, ruthenium, osmium and so forth, and iron, cobalt, copper and tin, and more preferably contains at least silver in view of conductivity.

Silver and at least one metal selected from noble metals other than silver are also preferably contained in order to support conductivity and stability (resistance to sulfuration or oxidation of metal nanowires, and resistance to migration) at the same time. When the metal nanowire of the present invention contains at least two metal elements, for example, the surface and the inside of the metal nanowire may be different from each other, and the whole metal nanowire may have the same metal composition.

The manufacturing means of the metal nanowire is not specifically limited, for example, a commonly known means such as a liquid phase method, a vapor phase method or the like is usable. Further, a specific manufacturing method is not specifically limited either, and a commonly known manufacturing method is usable.

As a method of manufacturing Ag nanowires cited are, for example, Adv. Mater. 2002, 14, 833-837 and Chem. Mater. 2002, 14, 4736-4745. As a method of manufacturing Au nanowires cited is Japanese Patent O.P.I. Publication No. 2006-233252. As a method of manufacturing Cu nanowires cited is Japanese Patent O.P.I. Publication No. 2002-266007. As a method of manufacturing Co nanowires cited is Japanese Patent O.P.I. Publication No. 2004-149871. Specifically, in the case of the above-described method of manufacturing Ag nanowires as described in Adv. Mater. 2002, 14, 833-837 and Chem. Mater. 2002, 14, 4736-4745, Ag nanowires can be prepared simply in an aqueous system, and further, since electrical conductivity of silver is the highest among all metals, this is preferably applicable as a method of manufacturing metal nanowires according to the present invention.

A three-dimensional conductive network is produced by making metal nanowires to come in contact with each other to generate high conductivity, and light is possible to pass through a window portion of the conductive network in which no metal nanowire is present. Thus, electric power is possible to be effectively generated from an organic power generation layer section further via the scattering effect of the metal nanowires. When as to the first electrode, metal nanowires are provided on the side close to the organic power generation layer section, this is more preferable since this scattering effect is more effectively utilized.

(Optical Function Layer)

A organic photoelectric conversion element may possess various optical function layers for the purpose of effectively receiving light from sunlight. As an optical function layer, provided may be, for example, an antireflection layer, a light collecting layer such as microlens array or the like, a light diffusion layer capable of diffusing light reflected at a cathode to make it to enter a power generation layer again, and or the like.

Each of various antireflection layers are usable as an antireflection layer, but for example, in cases where a transparent resin film is a biaxially stretching polyethylene terephthalate film, it is preferable that an easy adhesion layer adjacent to the film has a refraction index of 1.57-1.63, since transmittance can be improved by reducing interface reflection between a film substrate and the easy adhesion layer. In order to adjust refraction index, there is a method in which a content ratio of a binder resin to oxide sol exhibiting considerably high refractive index such as tin oxide sol, cerium oxide sol or the like is appropriately adjusted to conduct a coating process. The easy adhesion layer may be a single layer, but may allowed to be composed of at least two layers in order to improve adhesiveness.

As to the light collecting layer, for example, a structure on a microlens array is provided on the sunlight receiving side of a support substrate to conduct a processing, or used in combination with a so-called light collecting sheet to increase a light receiving amount from the specific direction, whereby in contrast, sunlight incident angle dependency can be reduced.

As an example of the microlens array, square pyramids each having 30 μm on a side and an apex angle of 90° on the light taking-out side of a substrate are two-dimensionally arrayed. Preferable are 10-100 μm on a side. When being smaller than this range, a diffraction effect is generated, whereby tinting thereof is seen, and when exceeding this range, thickness thereof is undesirably thickened.

Further, examples of the light diffusion layer include various antiglare layers, a layer in which nanoparticle nanowire made of metal, each of various inorganic oxides, or the like is dispersed in a colorlessly transparent polymer, and so forth.

(Film Formation Method•Surface Treatment Method)

Exemplified examples of a method of preparing a transparent layer•electrode and a bulk heterojunction layer in which electron acceptors and electron donors are mixed include an evaporation method, coating methods (including a cast method and a spin coating method) and so forth. Of these, exemplified examples of the bulk heterojunction layer include an evaporation method, coating methods (including a cast method and a spin coating method) and so forth.

Of these, a coating method is preferable in order to increase the interfacial area in which the foregoing holes and electrons are charge-separated, and to prepare an element exhibiting high photoelectric conversion efficiency. Further, the coating method has an excellent manufacturing speed.

A coating method employed in this case is not limited, but patterning can be conducted by each of printing methods such as a spin coating method, a solution casting method, a dip coating method, a blade coating method, a wire bar coating method, a gravure coating method, a spray coating method and so forth. Further, patterning can be also conducted by each of printing methods such as an ink-jet method, a screen printing method, a letterpress printing method, an intaglio printing, an offset printing method, a flexographic printing method and so forth.

Heating is preferably conducted after coating in order to produce mobility improvement absorption long-wave occurrence via removal of a residual solvent, moisture content and gas, and crystallization of a semiconductor material. When an annealing treatment is conducted at the predetermined temperature in a manufacturing step, coagulation or crystallization is partially and microscopically accelerated, whereby a bulk heterojunction layer having a phase-separation structure can be realized. As a result, carrier mobility of the bulk heterojunction layer can be improved to obtain high efficiency.

A power generation layer (bulk teterojunction layer) may be composed of a single layer in which electron acceptors and electron donors are evenly mixed, but may be composed of plural layers each in which a mixing ratio of electron acceptors to electron donors is changed. In this case, preparation thereof becomes possible when a material capable of being insoluble is used after coating as described before.

(Patterning)

The present invention is not specifically limited to methods and processes of patterning an electrode, a power generation layer, a hole transport layer, an electron transport layer and so forth, and commonly known methods are appropriately applicable.

In the case of a soluble material for a bulk heterojunction layer, a transport layer and so forth, only undesired portions may be removed after coating the entire surface via die coating, dip coating and or the like, direct patterning may be conducted during coating by utilizing an ink-jet method, a screen printing method or the like.

In the case of an insoluble material such as an electrode material or the like, mask evaporation can be conducted during vacuum deposition of an electrode, and pattering can be also conducted by a commonly known method such as etching, lift-off or the like. Further, a pattern having been prepared on another substrate may be transferred to prepare the pattern.

EXAMPLE

Next, the present invention will be specifically described referring to Examples, but the present invention is not limited thereto.

Example 1

<<Preparation of Gas Barrier Film>>

As described below, gas barrier film F was prepared via a step in which a substrate was first prepared, and a gas barrier layer was subsequently prepared on the substrate.

<<Preparation of Substrate>>

Employing polyester film (super-low heat shrinkage PET Q83, produced by Teijin Dupont Films Japan Ltd.) having a thickness of 125 μm, whose surfaces each are subjected to an easy adhesion treatment, as a thermoplastic resin substrate, one in which a bleed-out protection layer is provided on one surface, and a flat and smooth layer is provided on another surface is used as a substrate.

(Formation of Bleed-Out Protection Layer)

After a UV curable organic/inorganic hybrid hard coat material OPSTAR Z7535 produced by JSR Corporation was coated on one surface of the above-described substrate so as to give a dry film thickness of 4 μm, curing was conducted under the curing conditions of 1.0 J/cm$^2$, air atmosphere, and use of a high pressure mercury lamp; and the drying conditions of 80° C. and 3 minutes to form a bleed-out protection layer.

(Formation of Flat and Smooth Layer)

Next, a UV curable organic/inorganic hybrid hard coat material OPSTAR Z7501 produced by JSR Corporation was coated on another surface of the above-described substrate so as to give a dry film thickness of 4 μm, followed by drying curing under the drying conditions of 80° C. and 3 minutes, and curing was subsequently conducted under the curing conditions of 1.0 J/cm$^2$, air atmosphere, and use of a high pressure mercury lamp to form a flat and smooth layer.

The surface roughness of the resulting flat and smooth layer, specified in accordance with JIS B 0601 had a maximum cross-sectional height Rt (p) of 16 nm.

The surface roughness was measured employing an AFM (atomic force microscope) SP13800 NDFM, manufactured by Seiko Instruments Inc. After measuring conducted once was set to a measurement range of 80 μm×80 μm, and measuring was conducted three times while changing measurement locations, values of Rt each obtained by each measurement were averaged out to be designated as a measured value.

<<Preparation of Gas Barrier Layer>>

(Step of Coating and Drying, and Step of Conducting Modification Treatment Via Exposure to Vacuum UV Radiation)

Prepared were gas barrier films 1-20 shown in Table 1, each in which two gas barrier layers each having a thickness of 150 nm were laminated, as described hereinafter.

The step of conducting a modification treatment via exposure to vacuum UV radiation is performed by a vacuum UV radiation exposure apparatus shown by a schematic diagram as an example in FIG. 1, and a coating solution containing the after-mentioned polysilazane compound was coated on the above-prepared substrate to be continuously transported so as to give a dry thickness of 150 nm, employing an unshown depressurization-extruding system coater to prep are a gas barrier layer as the first layer.

After coating, drying was conducted by an unshown dryer. As the drying conditions, the drying duration was 90 seconds at a transporting speed of 5 m/min; the drying temperature was 100° C.; and the dew point in drying atmosphere was adjusted to 5° C.

After drying, a modification treatment was conducted via exposure thereof to vacuum UV radiation shown in a figure as an example. In FIG. 1, numerals 1, 2 and 3 represent a substrate, an Xe excimer lamp used for exposure to vacuum UV radiation having a wavelength of 172 nm, and an excimer lamp holder also serving as an external electrode, respectively. For the detailed conditions of the number of lamps used for exposure to vacuum UV radiation, illuminance distribution patterns, transporting speed and so forth, used were those shown in Table 1. Numeral values of the foregoing E1 and E1/E2 were also shown in Table 1. Further, details of illuminance distribution patterns A-N were shown in FIGS. 2-15. In FIGS. 2-15, the vertical axis represents illuminance on the surface of a film and the horizontal axis represents positions in the transporting direction (longitudinal direction) of a substrate.

Numeral 4 represents a chamber to hold nitrogen atmosphere, and nitrogen can be supplied from an unshown dry nitrogen supply opening to reduce concentration of oxygen in the chamber. In the present Example, the concentration of oxygen in the chamber was adjusted so as to make it to be 100 ppm or less. Numeral 5 represents a temperature-adjustable back roll made of metal. In the present Example, temperature of the back roll was adjusted to 80° C.

After conducting a modification treatment, a substrate on which a gas barrier layer was formed was wound by an unshown roll-up core.

Similarly, a gas barrier layer as the second layer was formed on a gas barrier layer as the first layer to obtain each of gas barrier films 1-20.

(Preparation of Coating Solution Containing Polysilazane Compound)

As to the coating solution containing a polysilazane compound, a dibutyl ether solution of 20% by weight non-catalytic perhydropolysilazane (AQUAMICA NN120-20, produced by AZ electronic materials Co., Ltd.) and a dibutyl ether solution of 20% by weight perhydropolysilazane containing a 5% by weight amine catalyst in solid content (AQUAMICA NAX120-20, produced by AZ electronic materials Co., Ltd.) were mixed to adjust the amine catalyst to 1% by weight in solid content, followed by further diluting with a dibutyl ether solution to prepare the foregoing coating solution as a 5% by weight dibutyl ether solution.

(Apparatus of Preparing Water Vapor Barrier Property Evaluation Sample)

Evaporator: Vacuum evaporator JEE-400 manufactured by JEOL Ltd.

Constant temperature and humidity oven: Yamato Humidic Chamber IG47M (Raw Material)

Metal corroded via reaction with water: Calcium (in the form of particles)

Water vapor impermeable metal: Aluminum (in the form of particles each having a diameter of 3-5 mm)

(Preparation of Water Vapor Barrier Property Sample)

Metal calcium having a size of 12 mm×12 mm was evaporated on the surface of a gas barrier layer of each of the resulting gas barrier films 1-20 via a mask, employing a vacuum-evaporator JEE-400 manufactured by JEOL Ltd.

The mask was subsequently removed therefrom in vacuum, and aluminum was evaporated on the entire surface on one side of a sheet for tentatively sealing. Next, after releasing a vacuum state, it was replaced by a dry nitrogen atmosphere. Quartz glass having a thickness of 0.2 mm was attached onto the aluminum-evaporated surface via a UV curable resin (produced by Nagase ChemteX Corporation) for scaling, and the resulting was exposed to UV radiation to cure the resin for adhesion for actually sealing. Thus, water vapor barrier property evaluation samples each were prepared.

The resulting sample was stored at high temperature of 60° C. and at high humidity of 90% RH, and a ratio (expressed by %) of an area where metal calcium was corroded to an area of 12 mm×12 mm on which metal calcium was evaporated was calculated with respect to storage thereof for each of 20 hours, 40 hours, 60 hours, and was evaluated in accordance with the following criteria. Results are shown in Table 1.

(Evaluation Criteria)

A: Area where metal calcium has been corroded is less than 1%.

B: Area where metal calcium has been corroded is not less than 1% and less than 5%.

C: Area where metal calcium has been corroded is not less than 5%.

TABLE 1

| Gas barrier film | Excimer exposure condition No. | The number of excimer lamps | Lamp center interval (mm) | Exposure distribution pattern | Time ratio of T period (%) | Illuminance on coating surface (mW/cm$^2$) | Transporting speed (m/min) | *1 | *2 | E2/E1 | Evaluation of water vapor barrier property | | | Remarks |
|---|---|---|---|---|---|---|---|---|---|---|---|---|---|---|
| | | | | | | | | | | | 20 hours | 40 hours | 60 hours | |
| 1 | 1 | 15 | 50 | A | 71 | 90 | 5.0 | 512 | 97 | 0.19 | A | A | A | Inv. |
| 2 | 2 | 15 | 50 | A | 71 | 90 | 2.5 | 1024 | 194 | 0.19 | A | A | A | Inv. |
| 3 | 3 | 15 | 50 | A | 71 | 90 | 1.8 | 1422 | 270 | 0.19 | A | A | B | Inv. |
| 4 | 4 | 15 | 50 | A | 71 | 90 | 1.3 | 1969 | 374 | 0.19 | B | C | C | Comp. |
| 5 | 5 | 8 | 100 | B | 33 | 90 | 5.0 | 237 | 88 | 0.37 | A | B | B | Inv. |
| 6 | 6 | 7 | 50 | C | 65 | 90 | 5.0 | 236 | 48 | 0.20 | A | A | B | Inv. |
| 7 | 7 | 5 | 150 | D | 23 | 90 | 5.0 | 148 | 55 | 0.37 | B | C | C | Comp. |
| 8 | 8 | 15 | 50 | E | 85 | 69 | 5.0 | 574 | 22 | 0.04 | A | A | A | Inv. |
| 9 | 9 | 10 | 75 | F | 35 | 60 | 5.0 | 196 | 202 | 1.03 | A | B | B | Inv. |
| 10 | 10 | 7 | 50 | G | 72 | 69 | 5.0 | 256 | 22 | 0.08 | A | A | B | Inv. |
| 11 | 11 | 15 | 50 | H | 0 | 30 | 5.0 | 0 | 190 | | C | C | C | Comp. |
| 12 | 12 | 15 | 50 | I | 0 | 40 | 5.0 | 0 | 235 | | C | C | C | Comp. |
| 13 | 13 | 15 | 50 | I | 0 | 40 | 1.3 | 0 | 902 | | C | C | C | Comp. |
| 14 | 14 | 15 | 50 | J | 69 | 120 | 5.0 | 604 | 100 | 0.17 | A | A | A | Inv. |
| 15 | 15 | 15 | 30 | K | 88 | 136 | 5.0 | 696 | 8 | 0.01 | A | A | A | Inv. |
| 16 | 16 | 15 | 30 | K | 88 | 136 | 2.5 | 1391 | 17 | 0.01 | A | A | A | Inv. |
| 17 | 17 | 15 | 30 | L | 8 | 176 | 5.0 | 56 | 854 | 15.37 | B | B | C | Comp. |
| 18 | 18 | 10 | 50 | M | 77 | 58 | 5.0 | 305 | 26 | 0.08 | A | A | A | Inv. |
| 19 | 19 | 12 | 50 | N | 0 | 44 | 5.0 | 0 | 302 | | C | C | C | Comp. |
| 20 | 20 | 12 | 50 | N | 0 | 44 | 2.5 | 0 | 604 | | C | C | C | Comp. |

*1: Integral exposure energy E1 (50 mW/cm$^2$-160 mW/cm$^2$)
*2: Integral exposure energy E2 (less than 50 mW/cm$^2$ and more than 160 mW/cm$^2$)
Inv.: Present invention,
Comp.: Comparative example As shown in Table 1, it is to be understood that gas barrier films each exhibiting a high barrier property are obtained by a method of preparing a gas barrier film of the present invention.

EXPLANATION OF NUMERALS

1 Substrate
2 Excimer lamp
3 Excimer lamp supporting member
4 Irradiation chamber
5 back roll

The invention claimed is:

1. A method of manufacturing a gas barrier film comprising a substrate in the form of a belt and provided thereon, a gas barrier layer containing silicon oxide, comprising:
a coating step in which a coating solution comprising a polysilazane compound is coated on the substrate to form a coating film, and
a UV radiation exposure step in which the coating film is exposed to vacuum UV radiation emitted from plural light sources facing the substrate while moving the substrate on which the coating film is formed relatively to the plural light sources of the vacuum UV radiation, the plural light sources each exhibiting even illuminance along a width direction of the substrate to form the gas barrier layer,
wherein in the UV radiation exposure step,
during a period from beginning of vacuum UV radiation exposure to end of the vacuum UV radiation exposure, a surface of the coating film is exposed to the vacuum UV radiation exhibiting an illuminance of not more than 160 mW/cm$^2$;
during T period, the surface of the coating film is exposed to the vacuum UV radiation exhibiting an illuminance of not less than 50 mW/cm$^2$ and not more than 160 mW/cm$^2$;
during the T period, integral exposure energy amount E1 of the vacuum UV radiation to which the surface of the coating film is exposed is not less than 180 mJ/cm$^2$ and not more than 1800 mJ/cm$^2$; and
a ratio of E2/E1 is more than 0 and not more than 0.25, provided that during the period excluding the T period, an integral exposure energy amount of the vacuum UV radiation to which the surface of the coating film is exposed is E2.

2. The method of claim 1,
wherein a ratio of the T period to a total period of Z in the UV radiation exposure step is not less than 30%.

3. The method of claim 2,
wherein the ratio is not less than 70%.

4. The method of claim 3,
wherein the T period in the UV radiation exposure step consists of one period.

5. The method of claim 1,
wherein the substrate has a thickness of 5-500 μm.

6. The method of claim 1, comprising the step of:
forming an anchor coating agent layer on a substrate surface on a side where the coating film is formed.

7. The method of claim 1, comprising the step of:
forming a flat and smooth layer between the substrate and the gas barrier layer.

8. The method of claim 7,
wherein the flat and smooth layer has a maximum cross-section height Rt(p) of 10-30 nm.

9. The method of claim 1, comprising the step of:
forming a bleed-out protection layer on a side opposite to a flat and smooth layer of the substrate.

10. The method of claim 9,
wherein the bleed-out protection layer has a thickness of 1-10 μm.

11. The method of claim 1,
wherein the coating film has a dry thickness of 1 nm to 10 μm.

12. The method of claim 1,
wherein the polysilazane compound comprises perhydropolysilazane.

13. The method of claim 1,
wherein the polysilazane compound in a polysilazane compound-containing coating solution has a content of 0.2-35% by weight.

14. The method of claim 1,
wherein the gas barrier layer comprises silicon oxide.

15. The method of claim 1, comprising the step of:
moving the substrate in a longitudinal direction with respect to the plural light sources each of which position is fixed.

16. The method of claim 1,
wherein a moving speed of the substrate is in a range of 0.2 m/min to 100 m/min.

17. The method of claim 1, comprising the step of:
forming an overcoat layer on the gas barrier layer.

* * * * *